(12) United States Patent
Yamada et al.

(10) Patent No.: US 11,037,734 B2
(45) Date of Patent: Jun. 15, 2021

(54) MOUNTING STRUCTURE FOR CAPACITOR AND RESISTOR, INPUT UNIT, AND MEASURING APPARATUS

(71) Applicant: HIOKI E.E. CORPORATION, Nagano (JP)

(72) Inventors: Shuhei Yamada, Nagano (JP); Kazunobu Hayashi, Nagano (JP); Kenichi Seki, Nagano (JP); Hajime Yoda, Nagano (JP); Toshio Heishi, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 0 days.

(21) Appl. No.: 16/715,493

(22) Filed: Dec. 16, 2019

(65) Prior Publication Data

US 2020/0203080 A1    Jun. 25, 2020

(30) Foreign Application Priority Data

Dec. 20, 2018  (JP) .............................. JP2018-238602
Aug. 7, 2019   (JP) .............................. JP2019-144991

(51) Int. Cl.
*H01G 4/40*     (2006.01)
*H01C 1/01*     (2006.01)
(Continued)

(52) U.S. Cl.
CPC ................ *H01G 4/40* (2013.01); *H01C 1/01* (2013.01); *H01C 1/14* (2013.01); *H01C 1/16* (2013.01);
(Continued)

(58) Field of Classification Search
CPC ....................................................... H01G 4/40
(Continued)

(56) References Cited

U.S. PATENT DOCUMENTS 6,542,352 B1 * 4/2003 Devoe .................... H01G 4/228
361/306.1

FOREIGN PATENT DOCUMENTS

JP    2014055848    * 9/2012
JP    2015012209    * 7/2013
(Continued)

OTHER PUBLICATIONS

Extended European Search Report, dated May 25, 2020, issued by the European Patent Office (EPO) in patent family member EP Patent Application No. 19217318.5.

*Primary Examiner* — Stanley Tso
(74) *Attorney, Agent, or Firm* — Greenblum & Bernstein, P.L.C.

(57) ABSTRACT

A mounting structure minimizes the influence of displacements, along a length direction of a resistor, in mounting positions of capacitor electrodes on the electrical characteristics of a circuit including a parallel circuit composed of a capacitor and the resistor. The capacitor has first and second electrodes, which respectively include first and second side surface portions disposed in parallel to a length direction of the resistor. The resistor has a first resistance body corresponding to the first side surface portions and a second resistance body corresponding to the second side surface portions that are separately disposed along the length direction and connected in series via a wire, and is mounted so that the first resistance body is positioned directly facing the first side surface portions and the second resistance body is positioned directly facing the second side surface portions.

18 Claims, 7 Drawing Sheets

(51) Int. Cl.
  *H01C 1/14* (2006.01)
  *H01C 1/16* (2006.01)
  *H01G 4/005* (2006.01)
  *H05K 1/18* (2006.01)

(52) U.S. Cl.
  CPC ............. *H01G 4/005* (2013.01); *H05K 1/181* (2013.01); *H05K 2201/10015* (2013.01); *H05K 2201/10022* (2013.01)

(58) Field of Classification Search
  USPC ........................................................ 361/803
  See application file for complete search history.

(56) References Cited

FOREIGN PATENT DOCUMENTS

| JP | 2014-055848 A | | 3/2014 |
|----|---------------|---|--------|
| JP | 2016114561 | * | 12/2014 |
| JP | 2015-012209 A | | 1/2015 |
| JP | 2016-114561 A | | 6/2016 |

* cited by examiner

MOUNTING STRUCTURE FOR CAPACITOR AND RESISTOR, INPUT UNIT, AND MEASURING APPARATUS

FIELD OF THE INVENTION

The present invention relates to a mounting structure for a capacitor and a resistor that are connected to each other in parallel, an input unit equipped with this mounting structure, and a measuring apparatus equipped with this input unit.

DESCRIPTION OF THE RELATED ART

As one example of a mounting structure for a capacitor and a resistance member of this type, the present inventors have already proposed the mounting structure for a capacitor and a resistance member disclosed in Patent Literature 1 (Japanese Laid-open Patent Publication No. 2014-55848). The proposed mounting structure is a mounting structure that mounts a capacitor and a resistance member (input resistor), which construct a voltage input resistance unit of a voltage measuring device, on a circuit board (printed circuit board). As depicted in FIG. 12, by mounting (attaching) a capacitor 51 and a resistor 61 as a resistance member on a circuit board 71, the capacitor 51 and the resistor 61 are connected to each other in parallel via the circuit board 71 (in more detail, via through holes or conductors such as a wiring pattern, not illustrated, formed on the circuit board 71).

The capacitor 51 is a capacitor which has one electrode 52 and another electrode 53 (both electrodes are formed of a conductive metal material) mounted on the circuit board 71 with a gap in between, and is constructed of an electrostatic capacitance formed between both electrodes 52 and 53. Since air is used as the dielectric, the capacitor 51 can be configured to have an arbitrary withstand voltage (including a high withstand voltage such as several kV) and a stable and highly accurate capacitance value.

In more detail, the one electrode 52 is composed of a pair of side plate portions 52a and 52b and a connecting plate portion 52c that spans between the side plate portions 52a and 52b, and is mounted (disposed) in substantially a U shape (when viewed from above) on the circuit board 71. The other electrode 53 is composed of a pair of side plate portions 53a and 53b that are disposed so as to be parallel to and on the outsides of the pair of side plate portions 52a and 52b of the one electrode 52 and a connecting plate portion 53c that spans between the side plate portions 53a and 53b, and is mounted (disposed) in approximately a U shape (when viewed from above) on the circuit board 71 having been assembled with the opposite orientation to the one electrode 52.

The capacitor 51 is formed by mounting (disposing) the side plate portions 52a and 52b of the one electrode 52 on the circuit board 71 with a positional relationship such that parts of the side plate portions 52a and 52b are non-facing surfaces that do not overlap a facing side plate portion out of the side plate portions 53a and 53b of the other electrode 53. In more detail, as depicted in FIG. 12, it is ensured that the side plate portions 52a and 52b are respectively provided with non-facing surfaces (the parts in the area AR1 in FIG. 12) that do not overlap the side plate portions 53a and 53b of the other electrode 53 and facing surfaces (the parts in the area AR2 in FIG. 12) that overlap the side plate portions 53a and 53b. Likewise, it is ensured that the side plate portions 53a and 53b are respectively provided with non-facing surfaces (the parts in the area AR3 in FIG. 12) that do not overlap the side plate portions 52a and 52b of the one electrode 52 and facing surfaces (surfaces that face the area AR2 parts of the side plate portions 52a and 52b) that overlap the side plate portions 52a and 52b.

The resistor 61 is mounted on the circuit board 71 in a state where the length direction of the resistor 61 (the direction indicated by the arrow A in FIG. 12) is substantially parallel to the side plate portions 52a and 52b of the one electrode 52 and the side plate portions 53a and 53b of the other electrode 53, the connecting plate portion 52c end of the resistor 61 is positioned in a region between the side plate portions 52a and 52b so as to face the side plate portions 52a and 52b, and the connecting plate portion 53c end of the resistor 61 is positioned outside the region between the side plate portions 52a and 52b so as to face the side plate portions 53a and 53b. The resistor 61 is connected in parallel to the capacitor 51 by connecting one end in the length direction of the resistor 61 (the connecting plate portion 52c end) via the circuit board 71 to the connecting plate portion 52c and connecting the other end in the length direction (the connecting plate portion 53c end) via the circuit board 71 to the connecting plate portion 53c.

SUMMARY OF THE INVENTION

However, by further investigating the mounting structure for the capacitor 51 and the resistor 61 described above, the present inventors discovered a problem in that the electrical characteristics of an electronic circuit including a parallel circuit composed of a capacitor 51 and a resistor 61 fluctuate somewhat between individual circuit boards 71 to which the capacitor 51 and the resistor 61 have been attached. By carrying out further investigations, the present inventors discovered that one cause of these fluctuations is slight displacements along the length direction of the resistor 61 in the mounting positions of the one electrode 52 and the other electrode 53, that form the capacitor 51 relative to the resistor 61 due to dimensional discrepancies and assembly errors for the respective members.

The present invention was conceived in view of the above problem to be solved and has a principal object of providing a mounting structure for a capacitor and a resistor capable of minimizing the influence of slight displacements, relative to the resistor and along the length direction of the resistor, in the mounting positions of electrodes that form the capacitor on the electrical characteristics of an electronic circuit including a parallel circuit composed of the capacitor and the resistor. It is another principal object of the present invention to provide an input unit equipped with this mounting structure for a capacitor and a resistor and also a measuring apparatus equipped with this input unit.

To achieve the stated object, a mounting structure for a capacitor and a resistor in a parallel circuit according to the present invention comprises: a resistor; and a capacitor, in which a first electrode connected to one terminal of the resistor and a second electrode connected to another terminal of the resistor are formed, wherein the first electrode includes a first electrode forming portion disposed so as to be parallel to a length direction of the resistor, the second electrode includes a second electrode forming portion disposed so as to be parallel to the length direction of the resistor, the resistor is configured by disposing a first resistance body and a second resistance body, which correspond one-to-one to the first electrode forming portion and the second electrode forming portion, so as to be separated along the length direction and connecting the first resistance body and the second resistance body in series via a wire, and the resistor is mounted so that the first resistance body is disposed directly facing the corresponding first electrode forming portion and the second resistance body is disposed directly facing the corresponding second electrode forming portion.

Accordingly, with the mounting structure for a capacitor and a resistor according to the present invention, even when the mounting positions of the first electrode forming portion of the first electrode and the second electrode forming portion of the second electrode that form the capacitor are somewhat displaced with respect to the resistor along the length direction of the resistor, a state where the first resistance body that constructs the resistor directly faces the corresponding first electrode forming portion and the state where the second resistance body that constructs the resistor directly faces the corresponding second electrode forming portion will always be maintained. This means that the influence of the mounting positions of the first electrode forming portion and the second electrode forming portion being displaced along the length direction can be suppressed to minimally affecting the electrical characteristics of the electronic circuit that includes a parallel circuit composed of the capacitor and the resistor.

Further, a mounting structure for a capacitor and a resistor in a parallel circuit according to the present invention comprises: a resistor; and a capacitor, in which a first electrode connected to one terminal of the resistor and a second electrode connected to another terminal of the resistor are formed, wherein at least one of the first electrode and the second electrode includes n, where n is an integer of two or higher, electrode forming portions aligned along a length direction of the resistor so as to be parallel to the length direction, the resistor is configured by disposing n resistance bodies, which correspond one-to-one to the n electrode forming portions so as to be separated along the length direction and connecting the n resistance bodies in series via wires, and the resistor is mounted so that the n resistance bodies are positioned directly facing the corresponding n electrode forming portions.

Therefore, with the mounting structure for a capacitor and a resistor according to the present invention, even if at least one electrode out of the first electrode and the second electrode that is constructed of n electrode forming portions is somewhat displaced along the length direction of the resistor, since a state where each of n resistance bodies that construct the resistor directly faces the corresponding one out of the n electrode forming portions is maintained, it is possible to minimize the influence of the mounting position of the at least one electrode being displaced along the length direction on the electrical characteristics of an electronic circuit including a parallel circuit composed of the capacitor and the resistor.

Further, in the mounting structure for a capacitor and a resistor according to the present invention, the resistor includes a single base formed of an insulating material, and each resistance body is formed on a surface of the base along a length direction of the base as the length direction.

Therefore, with the mounting structure for the capacitor and the resistor according to the present invention, since the resistor includes the first resistance body and the second resistance body that are formed on the surface of the same base along the length direction of the base, the resistor can be mounted with respect to the capacitor in a state where the positional relationship between the first resistance body and the second resistance body is always fixed. That is, the capacitor and the resistor can be mounted so that the first resistance body is positioned so as to directly face the corresponding first electrode forming portion and the second resistance body is positioned so as to directly face the corresponding second electrode forming portion.

Further, in the mounting structure for a capacitor and a resistor according to the present invention, the first electrode has a pair of first side surface portions that each function as the first electrode forming portion and a first connecting plate portion that spans between the first side surface portions disposed on a circuit board in substantially a U shape when viewed from above, the second electrode has a pair of second side surface portions that each function as the second electrode forming portion and a second connecting plate portion that spans between the second side surface portions disposed on the circuit board in substantially a U shape with an opposite orientation to the first electrode when viewed from above, and the resistor is disposed on the circuit board in a state where a disposed part of the first resistance body is positioned on an inside of the pair of first side surface portions and a disposed part of the second resistance body is positioned on an inside of the pair of second side surface portions.

Therefore, in the mounting structure for the capacitor and the resistor according to the present invention, the first electrode includes the pair of first side surface portions that each function as the first electrode forming portions and the first connecting plate portion that spans between the first side surface portions, and is disposed in substantially a U shape on the circuit board when viewed from above. The second electrode includes the pair of second side surface portions that each function as the second electrode forming portions and the second connecting plate portion that spans between the second side surface portions, and is disposed in substantially a U shape with the opposite orientation to the first electrode on the circuit board when viewed from above. The resistor is disposed on the circuit board in a state where the disposed position of the first resistance body is positioned on the inside of the pair of first side surface portions and the disposed position of the second resistance body is positioned on the inside of the pair of second side surface portions. Accordingly, by using this mounting structure, it is possible to easily mount on the circuit board so that the first electrode forming portions (the first side surface portions) of the first electrode and the second electrode forming portions (the second side surface portions) of the second electrode are parallel to the length direction of the resistor.

Further, in the mounting structure for a capacitor and a resistor according to the present invention, the first electrode is formed in a U shape with a pair of first side surface portions that each function as the first electrode forming portion and a first connecting plate portion that spans between the first side surface portions, and is disposed in a state where the pair of first side surface portions are erected on a circuit board as leg portions, the second electrode is formed in a U shape with a pair of second side surface portions that each function as the second electrode forming portion and a second connecting plate portion that spans between the second side surface portions, and is disposed in a state where the pair of second side surface portions are erected on the circuit board as leg portions, and the resistor is disposed on the circuit board in a state where a disposed part of the first resistance body is positioned on an inside of the pair of first side surface portions and a disposed part of the second resistance body is positioned on an inside of the pair of second side surface portions.

Accordingly, also with this mounting structure for the capacitor and the resistor, it is possible to easily mount on the circuit board so that the first electrode forming portions (the first side surface portions) of the first electrode and the second electrode forming portions (the second side surface portions) of the second electrode 12 become parallel to the length direction of the resistor.

Further, an input unit according to the present invention comprises a voltage inputter that inputs an input voltage, wherein the voltage inputter is configured by the parallel circuit composed of the resistor and the capacitor mounted using the mounting structure for a capacitor and a resistor according to any of the mounting structures described above.

Therefore, according to the input unit according to the present invention, since the voltage inputter is configured of a parallel circuit composed of the capacitor and the resistor that are mounted using any mounting structure out of the mounting structures for a capacitor and a resistor described above, the influence of displacements in the mounting positions described above on the electrical characteristics of electronic circuits including the parallel circuit can be minimized. By doing so, according to the input unit, it is possible to execute the processing on and output the input voltage in a state with little fluctuations (fluctuations in electrical characteristics.

Further, a measuring apparatus according to the present invention comprises the input unit described above and measures measured amounts.

Therefore, with the measuring apparatus according to the present invention, by including the input unit, it is possible to measure the measured amounts in a state with little fluctuations based on the input voltage that has been processed in this way in a state with little fluctuations.

It should be noted that the disclosure of the present invention relates to the contents of Japanese Patent Application No. 2018-238602 that was filed on Dec. 20, 2018, and Japanese Patent Application No. 2019-144991 that was filed on Aug. 7, 2019 the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a mounting structure for a capacitor and a resistor, an input unit, and a measuring apparatus will now be described with reference to the attached drawings.

Figure 1:
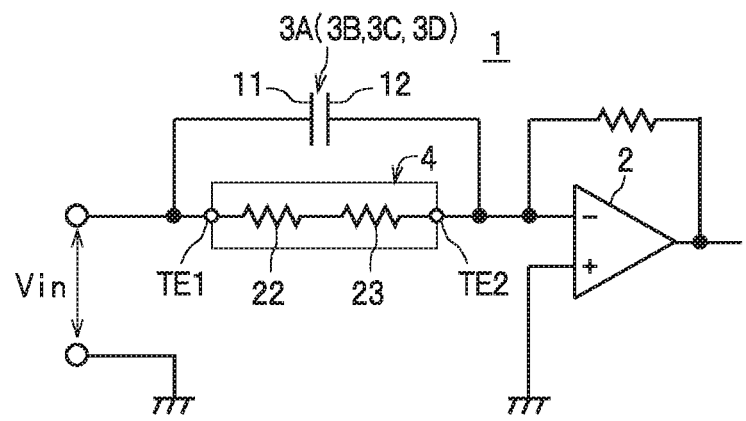
FIG. 1 is an equivalent circuit diagram depicting one example of an electronic circuit in which a mounting structure for a capacitor and a resistance member is used.

The mounting structure for a capacitor and a resistor described here is used as a mounting structure of a voltage inputter in a voltage measuring device, as one example, as depicted in FIG. 1, a voltage inputter constructed as a parallel circuit of a capacitor 3A and a resistance member 4 disposed as an input unit of an electronic circuit 1 (in this example, an electronic circuit including an operational amplifier 2) for inputting (feeding) an input voltage Vin into a voltage measuring device. Although the mounting structure according to the present invention is described below by way of an example mounting structure for the capacitor 3A and the resistance member 4 in an electronic circuit 1 to be mounted on a circuit board, it should be obvious that the present mounting structure can also be applied to a capacitor 3A and a resistance member 4 that are connected in parallel and mounted in a location aside from a circuit board.

First, the structure of the capacitor 3A and the resistance member 4 will be described with reference to FIGS. 1 to 3.

First, the structure of the capacitor 3A will be described. As depicted in FIG. 2, the capacitor 3A includes one electrode 11 as a first electrode and another electrode 12 as a second electrode that are mounted on a circuit board 5 with a gap in between. Both electrodes 11 and 12 are formed of a conductive metal material, and the capacitor 3A is a capacitor configured to use air present between the electrodes 11 and 12 as a dielectric. Since the capacitor 3A is configured in this way to use air as a dielectric, it is possible, depending on the shapes of the one electrode 11 and the other electrode 12 and the mounting layout of the one electrode 11 and the other electrode 12, to set an arbitrary withstand voltage (including a high withstand voltage such as several kV) and possible to maintain a stable and highly accurate capacitance value after mounting.

In more detail, the one electrode 11 is composed of a pair of first side surface portions 11a and 11b in the form of rectangular flat plates and a first connecting plate portion 11c in the form of a rectangular flat plate that spans between the first side surface portions 11a and 11b in a state that is substantially perpendicular to the first side surface portions 11a and 11b. The one electrode 11 is mounted (disposed) in substantially a U shape when viewed from above on the circuit board 5. The first side surface portions 11a and 11b are set so that their lengths from the first connecting plate portion 11c are the same, are disposed parallel to the length direction of the resistance member 4 (the direction of the arrow A in FIG. 1, hereinafter referred to as the "length direction A") that is mounted (disposed) on the inside of the first side surface portions 11a and 11b as described later, are disposed so as to be capable of facing the resistance member 4 (that is, so as to be capable of facing a surface of the resistance member 4 where a first resistance body 22 and a second resistance body 23, described later, are disposed), and respectively construct first electrode forming portions. Here, the first electrode forming portions on the one electrode 11 side and the second electrode forming portions, described later, on the other electrode 12 side are members that are disposed so as to be parallel to the length direction A of the resistance member 4 in a state where the electrode forming portions are capable of facing the resistance member 4. For the one electrode 11, the first side surface portions 11a and 11b construct the first electrode forming portions as described above, and for the other electrode 12, the second side surface portions 12a and 12b construct the second electrode forming portions as described later.

The other electrode 12 is composed of a pair of second side surface portions 12a and 12b (as one example in the present embodiment, the distance between the second side surface portions 12a and 12b is set larger than the distance between the pair of first side surface portions 11a and 11b and the second side surface portions 12a and 12b are disposed to the outside of the pair of first side surface portions 11a and 11b) in the form of rectangular flat plates and a second connecting plate portion 12c in the form of a rectangular flat plate that spans between the second side surface portions 12a and 12b in a state that is substantially perpendicular to the second side surface portions 12a and 12b. The other electrode 12 is mounted (disposed) in substantially a U shape when viewed from above on the circuit board 5 with the opposite orientation to the one electrode 11. The second side surface portions 12a and 12b are set so that their lengths from the second connecting plate portion 12c are the same, are disposed parallel to the length direction A of the resistance member 4, are disposed so as to be capable of facing the resistance member 4, and respectively construct the second electrode forming portions.

The capacitor 3A is configured so that the first side surface portions 11a and 11b of the one electrode 11 are mounted (disposed) on the circuit board 5 according to a positional relationship that can ensure that parts of the first side surface portions 11a and 11b (here, parts at the first connecting plate portion 11c end) are non-facing surfaces that do not overlap the facing side surface portions out of the second side surface portions 12a and 12b of the other electrode 12 and so that the second side surface portions 12a and 12b of the other electrode 12 are mounted (disposed) on the circuit board 5 according to a positional relationship that can ensure that parts of the second side surface portions 12a and 12b (here, parts at the second connecting plate portion 12c end) are non-facing surfaces that do not overlap facing side surface portions out of the first side surface portions 11a and 11b of the one electrode 11. In more detail, as depicted in FIG. 2, as one example in the capacitor 3A according to the present embodiment, the first side surface portions 11a and 11b each have a non-facing surface that does not overlap the second side surface portions 12a and 12b of the other electrode 12 (the parts in an area AR1 in FIG. 2) and a facing surface that overlaps the second side surface portions 12a and 12b (the parts in an area AR2 in FIG. 2). In the same way, the second side surface portions 12a and 12b each have a non-facing surface that does not overlap the first side surface portions 11a and 11b of the one electrode 11 (the parts in an area AR3 in FIG. 2) and a facing surface that overlaps the first side surface portions 11a and 11b (the facing surfaces that face the area AR2 parts of the first side surface portions 11a and 11b).

The structure of the resistance member 4 will be described next. As depicted in FIG. 3 for example, the resistance member 4 includes: a single base 21 formed of an insulating material; a first resistance body 22 and a second resistance body 23 that are separately formed on the surface of the base 21 along the length direction of the base 21 (the direction in which the forming regions of the first resistance body 22 and the second resistance body 23 formed on the surface of the base 21 are aligned, and in this example, the direction A that is parallel to the longest edge of the base 21 which is formed as described later as a rectangular cuboid) and correspond on a one-to-one basis with the first electrode forming portions and second electrode forming portions of the capacitor 3A; and a pair of terminals TE1 and TE2 disposed at both ends along the length direction A of the base 21. The resistance member 4 is configured so that the entire surface of the base 21, including the first resistance body 22 and the second resistance body 23, is covered by an insulating coating, not illustrated.

Figure 3:
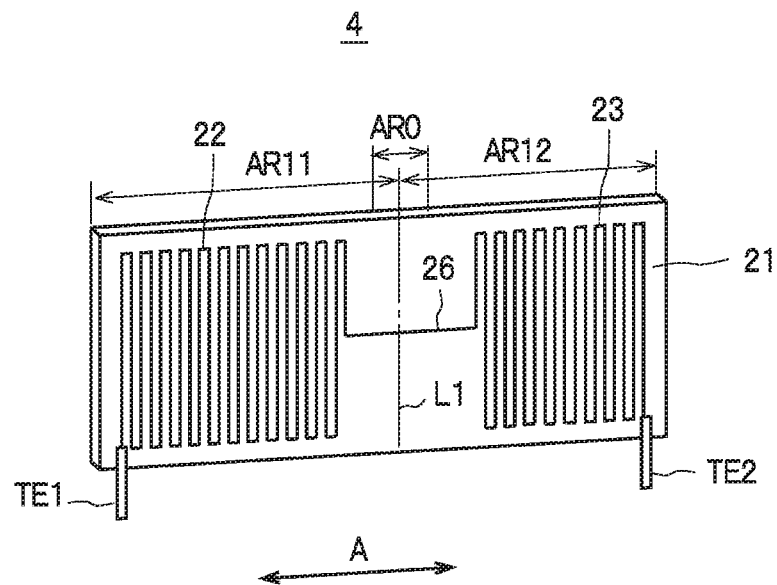
FIG. 3 is a perspective view useful in explaining the configuration of a resistance member.

In more detail, as depicted in FIG. 3, the base 21 is formed of a rectangular cuboid with a small thickness, for example. As one example in the present embodiment, the formation area AR11 of the first resistance body 22 (hereinafter simply referred to as the "area AR11") is disposed on the surface at one short-edge side, out of the pair of short edges of the surface of the base 21 (the short edge on the left in FIG. 3) and the formation area AR12 of the second resistance body 23 (hereinafter simply referred to as the "area AR12") is disposed on the surface at the other short-edge side of the surface of the base 21 (the short edge on the right in FIG. 3). Accordingly, with the resistance member 4 of this configuration, since the direction in which the areas AR11 and AR12 are aligned is parallel to the longer sides of the base 21 that is formed as a rectangular cuboid, as depicted in FIG. 3, the direction that is parallel to the longer sides is the length direction A.

Note that although not illustrated, for a resistance member 4 with a configuration where the area AR11 is disposed on a surface on one long-edge side out of the pair of long-edge sides of the surface of the base 21 and the area AR12 is disposed on a surface on the other long-edge side out of the surface of the base 21 (that is, a configuration where the up-down direction of the base 21 in FIG. 3 is longer than the left-right direction), the direction in which the areas AR11 and AR12 are aligned will be parallel to the short edges of the base 21 that is formed as a rectangular cuboid, so that the direction that is parallel to the short edges is the length direction A.

The pair of terminals TE1 and TE2 are disposed on one edge (in the configuration in FIG. 3, the long edge on the bottom) that is parallel to the length direction A of the base 21 so that one terminal, the terminal TE1, out of the pair of terminals TE1 and TE2 is positioned in the area AR11 and the other terminal TE2 is positioned in the area AR12. With this configuration, as depicted in FIG. 2, the resistance member 4 is mounted on the circuit board 5 in a state where a pair of edges (in the present embodiment, the pair of short edges) that are perpendicular to the length direction A of the base 21 are erected so as to be substantially perpendicular to the circuit board 5.

Figure 2:
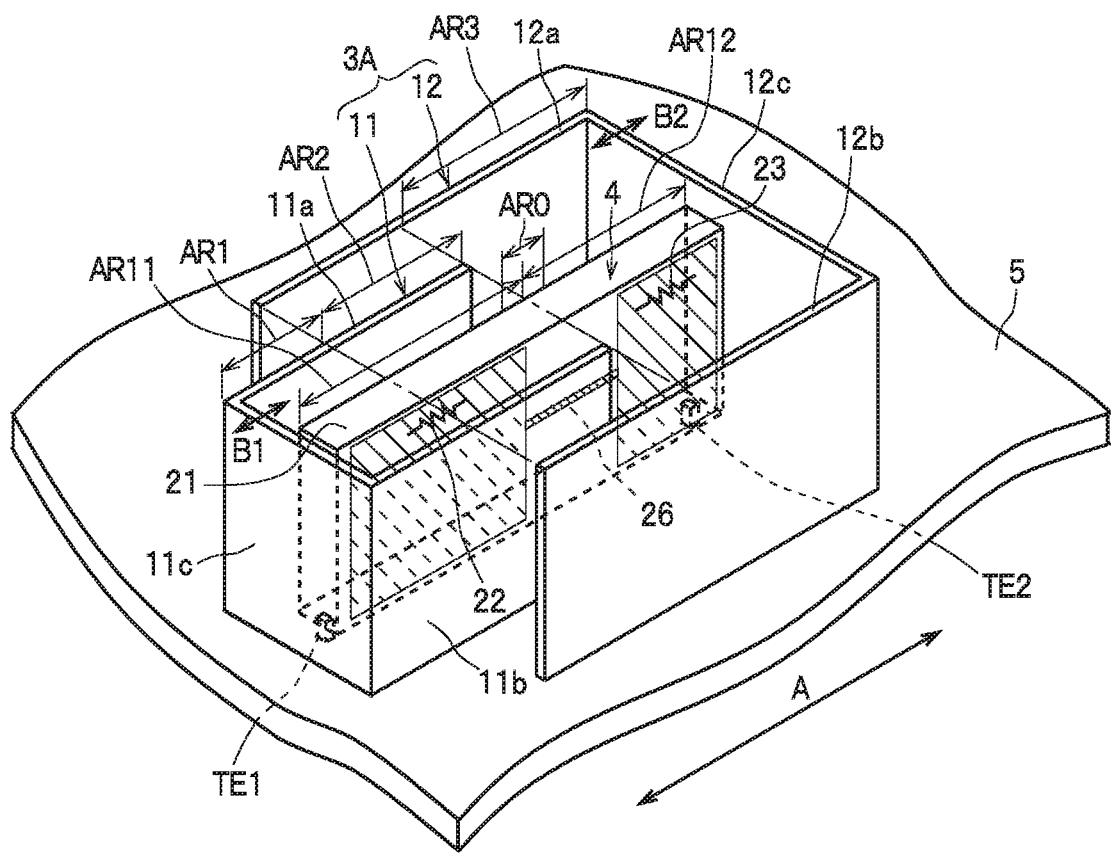
FIG. 2 is a perspective view useful in explaining a mounting structure for a capacitor and a resistance member that have been mounted on a circuit board.

As depicted in FIG. 3, the first resistance body 22 is disposed (formed) at a part that is in the area AR11 on the base 21 (in more detail, on a surface of the base 21 that becomes perpendicular to the circuit board 5 when the resistance member 4 is mounted on the circuit board 5 as depicted in FIG. 2) and is not included in an area AR0 described later (an area that may be part of the area AR11 and may be part of the area AR12), with an end of the first resistance body 22 on the side of one short edge (that is, the left end in FIG. 3) connected to one of the terminals, the terminal TE1. As depicted in FIG. 3, the second resistance body 23 is disposed (formed) at a part that is in the area AR12 on the base 21 (in more detail, on the surface of the base 21 that becomes perpendicular to the circuit board 5 when the resistance member 4 is mounted on the circuit board 5 depicted in FIG. 2) and is not included in the area AR0 so as to be separated from the first resistance body 22, with an end of the second resistance body 23 on the side of the other short edge (that is, the right end in FIG. 3) connected to the other terminal TE2. As depicted in FIGS. 2 and 3, the first resistance body 22 and the second resistance body 23 are connected in series via a wire 26 formed so as to cross the area AR0. Note that since the resistance value of the wire 26 itself is a sufficiently low value compared to the resistance values of the first resistance body 22 and the second resistance body 23, the wire 26 effectively does not function as a resistance body.

As depicted in FIG. 2, the resistance member 4 of this configuration is mounted on the circuit board 5 so that the area AR11 part of the resistance member 4 is positioned on the inside of the first side surface portions 11*a* and 11*b* (that is, inside a region sandwiched by the first side surface portions 11*a* and 11*b*) and faces the first side surface portions 11*a* and 11*b* (that is, the area AR11 part of the resistance member 4 is a part that directly faces the first side surface portions 11*a* and 11*b* that construct the first electrode forming portions) and the area AR12 part is positioned on the inside of the second side surface portions 12*a* and 12*b* (that is, inside a region sandwiched by the second side surface portions 12*a* and 12*b*) and in a region that is outside the region sandwiched by the first side surface portions 11*a* and 11*b* so as to face the second side surface portions 12*a* and 12*b* (that is, the area AR12 part of the resistance member 4 is a part that directly faces the second side surface portions 12*a* and 12*b* that construct the second electrode forming portion). By using this configuration, as depicted in FIGS. 2 and 3, the resistance member 4 (and also the base 21) is split in two along the length direction A into the area AR11 that directly faces the first side surface portions 11*a* and 11*b* that form the first electrode forming portions and the area AR12 that directly faces the second side surface portions 12*a* and 12*b* that form the second electrode forming portions.

As depicted in FIG. 1, by having one terminal TE1 that is positioned at the one electrode 11 end connected via the circuit board 5 to the one electrode 11 and the other terminal TE2 that is positioned at the other electrode 12 end connected via the circuit board 5 to the other electrode 12, the resistance member 4 is connected in parallel to the capacitor 3A.

With this configuration, since the first resistance body 22 is formed in the area AR11 that directly faces the first side surface portions 11*a* and 11*b* as the first electrode forming portions, the first resistance body 22 is a resistance body that corresponds to the first electrode forming portions, and since the first resistance body 22 is also formed in a part that is not included in the area AR0, the first resistance body 22 is a resistance body disposed so as to directly face only the first electrode forming portions. Likewise, since the second resistance body 23 is formed in the area AR12 that directly faces the second side surface portions 12*a* and 12*b* as the second electrode forming portions, the second resistance body 23 is a resistance body that corresponds to the second electrode forming portions, and since the second resistance body 23 is also formed in a part that is not included in the area AR0, the second resistance body 23 is a resistance body disposed so as to directly face only the second electrode forming portions.

As one example in the present embodiment, as depicted in FIG. 3, the first resistance body 22 and the second resistance body 23 are resistance bodies composed of resistance wires formed into continuous winding shapes along the length direction A. However, the first resistance body 22 and the second resistance body 23 are not limited to this configuration and although not illustrated, it is possible to use resistance bodies of various known configurations, such as resistance bodies composed of resistance wires formed into continuous winding shapes along a direction perpendicular to the circuit board 5 when mounted on the circuit board 5 (the short edge direction of the base 21 in FIG. 3).

Since the first resistance body 22 and the second resistance body 23 are formed on the same surface of the base 21 as one example, when the resistance member 4 mounted on the circuit board 5 is viewed from above, the first resistance body 22 and the second resistance body 23 are disposed in a straight line along the length direction A. Note that the first resistance body 22 and the second resistance body 23 are not limited to being formed on the same surface of the base 21 and the second resistance body 23 may be formed on the rear of the surface where the first resistance body 22 is formed (that is, another surface of the base 21 that is parallel to the length direction A and is perpendicular to the circuit board 5). That is, the first resistance body 22 and the second resistance body 23 may be formed on difference surfaces. In this case, since the base 21 is a rectangular cuboid and has a small thickness as described above, in a state where the resistance member 4 mounted on the circuit board 5 is viewed from above, a configuration where the first resistance body 22 and the second resistance body 23 are formed in this way on different surfaces of the base 21 will still effectively be a state where the first resistance body 22 and the second resistance body 23 are disposed in a straight line along the length direction A of the resistance member 4.

The resistance bodies themselves may be formed of carbon film resistors or metal film resistors. The shape of the base 21 is also not limited to the rectangular cuboid with a small thickness depicted in FIG. 3, and although not illustrated, it is possible to use a columnar shape with a polygonal cross section or a columnar shape such as an elliptical column or a cylindrical column. For a base 21 of this shape, it is possible to form the first resistance body 22 and the second resistance body 23 by forming carbon film resistors or metal film resistors separately along the axial direction (length direction) on an outer surface, or to form the first resistance body 22 and the second resistance body 23 by separately winding coil resistors around the outer surface along the axial direction (length direction).

However, as described earlier as the problem to be solved by the present invention, there are cases where the respective mounting positions of the one electrode 11 and the other electrode 12 are slightly displaced along the length direction A of the resistance member 4 as indicated by the arrows B1 and B2 (see FIG. 2) appended to the mounting positions. That is, there are cases where the positions of the one electrode 11 and the other electrode 12 relative to the resistance member 4 are displaced along the length direction A, and due to this, a boundary line L1 between the area AR11 and the area AR12 that divides the resistance member 4 and the base 21 into two along the length direction A shifts along the length direction A. Note that the boundary line L1 is also the boundary line between the parts of the first electrode forming portions (in the present embodiment, the first side surface portions 11a and 11b) that directly face the resistance member 4 and the parts of the second electrode forming portions (in the present embodiment, the second side surface portions 12a and 12b) that directly face the resistance member 4 (see FIG. 5). In the present embodiment, a region where this displaced boundary line L1 may be positioned is indicated using the symbol AR0 (see FIGS. 2 and 3). That is, the area AR0 is a region that may be part of the area AR11 and/or may be part of the area AR12. Note that although the actual displacement in the boundary line L1 is very small, the area AR0 is depicted in an exaggerated form in FIGS. 2 and 3 to make it easy to recognize the area AR0 being described.

With the resistance member 4 according to the present embodiment, as described above, the first resistance body 22 is a resistance body disposed in the area AR11 (that is, the part of the area AR11 aside from the part that may be the area AR0) on the base 21 so as to directly face only the first side surface portions 11a and 11b as the first electrode forming portions and the second resistance body 23 is a resistance body disposed in the area AR12 (that is, the part of the area AR12 aside from the part that may be the area AR0) on the base 21 so as to directly face only the second side surface portions 12a and 12b as the second electrode forming portions.

Figure 5:
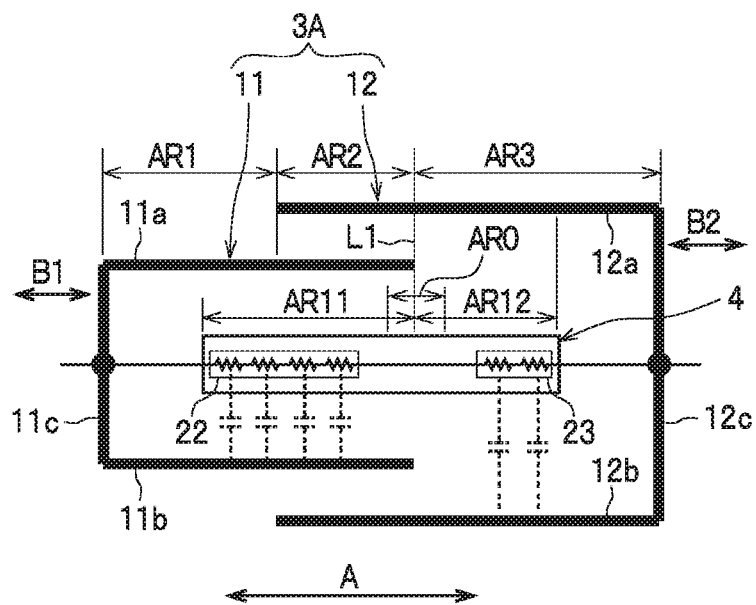
FIG. 5 is a schematic diagram useful in explaining a mounting structure for a capacitor and a resistance member when looking from above.

This means that even if the mounting positions of the one electrode 11 and the other electrode 12 are slightly displaced as indicated by the arrows B1 and B2 with respect to the resistance member 4 along the length direction A of the resistance member 4 (since the present embodiment is configured so that the first side surface portions 11a and 11b and the second side surface portions 12a and 12b have facing surfaces that overlap each other (the parts in the area AR2), displacement in the mounting position of the other electrode 12 has no effect and it is mainly displacements in the mounting position of the one electrode 11 that have an effect), the resistance value of the resistance body of the resistance member 4 that directly faces only the first side surface portions 11a and 11b (in the present embodiment, the first resistance body 22) will not change and the resistance value of the resistance body of the resistance member 4 that directly faces only the second side surface portions 12a and 12b (in the present embodiment, the second resistance body 23) will also not change. Also, as depicted in FIG. 5 that schematically depicts the mounting structure for the capacitor 3A and the resistance member 4 when looking from above, the capacitance value of the electrostatic capacitance formed between the first resistance body 22 and the first side surface portions 11a and 11b (for ease of understanding, only the electrostatic capacitance formed between the first resistance body 22 and the first side surface portion 11b is illustrated in FIG. 5) and the capacitance value of the electrostatic capacitance formed between the second resistance body 23 and the second side surface portions 12a and 12b (for ease of understanding, only the electrostatic capacitance formed between the second resistance body 23 and the second side surface portion 12b is illustrated in FIG. 5) will hardly change. From this, it can be understood that even if the respective mounting positions of the one electrode 11 and the other electrode 12 are displaced along the length direction A as depicted by the arrows B1 and B2, the electrical characteristics (for example, the frequency characteristics) of a voltage inputter constructed by a parallel circuit composed of the capacitor 3A and the resistance member 4 will hardly change.

Figure 4:
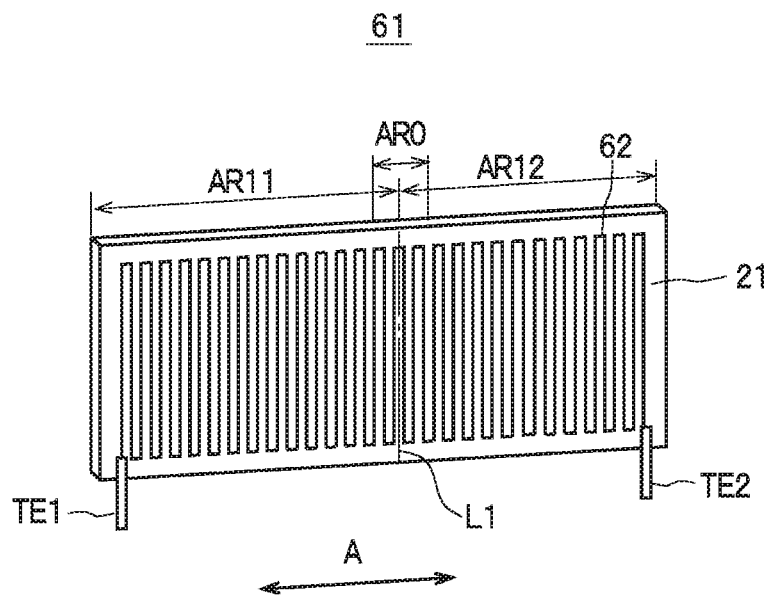
FIG. 4 is a perspective view useful in explaining the configuration of another resistance member as a comparative example of a resistance member.
Figure 6:
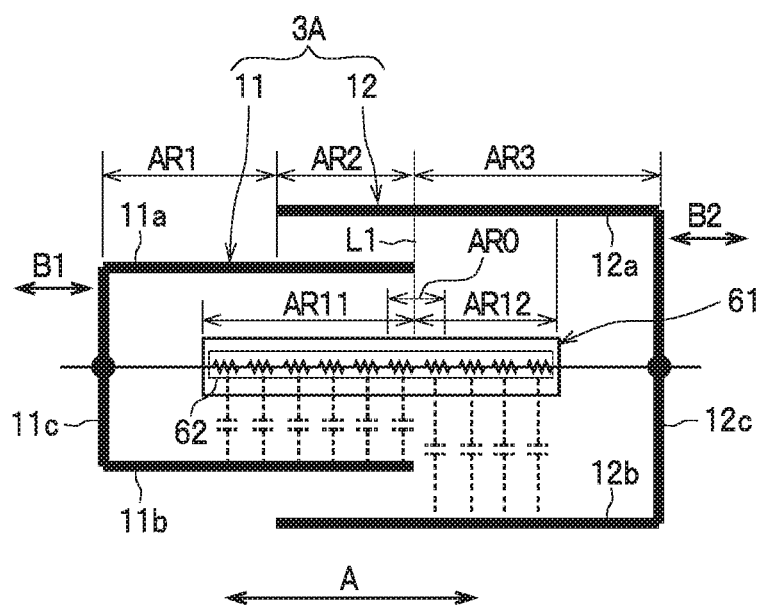
FIG. 6 is a schematic diagram useful in explaining a mounting structure for a capacitor and another resistance member when looking from above.

On the other hand, as depicted in FIG. 4, with a configuration that uses a resistance member 61 where a resistance body 62 is formed substantially uniformly along the length direction A across the entire area from one terminal TE1 to the other terminal TE2 on the base 21 (that is, a resistance member of the same construction as the resistor 61 described in the Background Art) in place of the resistance member 4, when the mounted positions of the one electrode 11 and the other electrode 12 are slightly displaced along the length direction A of the resistance member 61 with respect to the resistance member 61, the boundary line L1 between the area AR11 and the area AR12 will become displaced along the length direction A in the area AR0, so that the respective sizes of the areas AR11 and AR12 will change, resulting in the resistance values of the resistance bodies included in the areas AR11 and AR12 also changing (that is, the resistance value of the resistance body on the resistance member 61 that directly faces the first side surface portions 11a and 11b and the resistance value of the resistance body on the resistance member 61 that directly faces the second side surface portions 12a and 12b will change). Also, as depicted in FIG. 6 that schematically depicts the mounting structure for the capacitor 3A and the resistance member 61 when looking from above, the capacitance value of the electrostatic capacitance formed between the resistance body 62 and the first side surface portions 11a and 11b (for ease of understanding, only the electrostatic capacitance formed between the resistance body 62 and the first side surface portion 11b is illustrated in FIG. 6) and the capacitance value of the electrostatic capacitance formed between the resistance body 62 and the second side surface portions 12a and 12b (for ease of understanding, only the electrostatic capacitance formed between the resistance body 62 and the second side surface portion 12b is illustrated in FIG. 6) will also change. From this, it can be understood that if the respective mounting positions of the one electrode 11 and the other electrode 12 are displaced along the length direction A, the electrical characteristics (for example, the frequency characteristics) of a voltage inputter constructed by a parallel circuit composed of the capacitor 3A and the resistance member 61 will also change.

In this way, when the mounting structure for the capacitor 3A and the resistance member 4 is configured so as to include the first side surface portions 11a and 11b as first electrode forming portions disposed so that the one electrode 11 as a first electrode is parallel to the length direction A and to include the second side surface portions 12a and 12b as second electrode forming portions disposed so that the other electrode 12 as a second electrode is parallel to the length direction A, the resistance member 4 has the first resistance body 22 and the second resistance body 23 that correspond one-to-one to the first electrode forming portions (the first side surface portions 11a and 11b) and the second electrode forming portions (the second side surface portions 12a and 12b) separately disposed along the length direction A and connected in series via the wire 26, and is mounted together with the capacitor 3A on the circuit board 5 so that the first resistance body 22 is positioned so as to directly face only the first electrode forming portions (the first side surface portions 11a and 11b) that correspond to the first resistance body 22 and the second resistance body 23 is positioned so as to directly face only the second electrode forming portions (the second side surface portions 12a and 12b) that correspond to the second resistance body 23.

Accordingly, with this mounting structure for the capacitor 3A and the resistance member 4, even when the mounting positions of the first side surface portions 11a and 11b, out of the first side surface portions 11a and 11b and the second side surface portions 12a and 12b that form the capacitor 3A, are somewhat displaced with respect to the resistance member 4 along the length direction A of the resistance member 4, a state where the first resistance body 22 that constructs the resistance member 4 directly faces only the first electrode forming portions (the first side surface portions 11a and 11b) to which the first resistance body 22 corresponds (that is, a state where the first resistance body 22 mostly faces the first electrode forming portions) and the state where the second resistance body 23 that constructs the resistance member 4 directly faces only the second electrode forming portions (the second side surface portions 12a and 12b) to which the second resistance body 23 corresponds (that is, a state where the second resistance body 23 mostly faces the second electrode forming portions) will always be maintained. This means that the influence of the mounting positions of the first side surface portions 11a and 11b being displaced along the length direction A can be suppressed to minimally affecting the electrical characteristics of the electronic circuit 1 that includes a parallel circuit composed of the capacitor 3A and the resistance member 4.

According to this mounting structure for the capacitor 3A and the resistance member 4, since the resistance member 4 includes one base 21 that is formed of an insulating material and the first resistance body 22 and the second resistance body 23 are formed on the surface of the base 21 along the length direction A of the base 21, the resistance member 4 can be mounted with respect to the capacitor 3A in a state where the positional relationship between the first resistance body 22 and the second resistance body 23 is always fixed. That is, the capacitor 3A and the resistance member 4 can be mounted so that the first resistance body 22 is positioned so as to directly face only the first electrode forming portions (the first side surface portions 11a and 11b) that correspond to the first resistance body 22 and the second resistance body 23 is positioned so as to directly face only the second electrode forming portions (the second side surface portions 12a and 12b) that correspond to the second resistance body 23.

In this mounting structure for the capacitor 3A and the resistance member 4, the one electrode 11 as the first electrode includes the pair of first side surface portions 11a and 11b that each function as the first electrode forming portions and the first connecting plate portion 11c that spans between the first side surface portions 11a and 11b, and is disposed in substantially a U shape on the circuit board 5 when viewed from above. The other electrode 12 as the second electrode includes the pair of second side surface portions 12a and 12b that are disposed outside the pair of first side surface portions 11a and 11b and each function as the second electrode forming portions and the second connecting plate portion 12c that spans between the second side surface portions 12a and 12b, and is disposed in substantially a U shape with the opposite orientation to the one electrode 11 on the circuit board 5 when viewed from above. The resistance member 4 is disposed on the circuit board 5 in a state where the disposed position of the first resistance body 22 is positioned on the inside of the first side surface portions 11a and 11b and the disposed position of the second resistance body 23 is positioned on the inside of the second side surface portions 12a and 12b. Accordingly, by using this mounting structure, it is possible to easily mount on the circuit board 5 so that the first electrode forming portions (the first side surface portions 11a and 11b) of the one electrode 11 and the second electrode forming portions (second side surface portions 12a and 12b) of the other electrode 12 are parallel to the length direction A of the resistance member 4.

Figure 7:
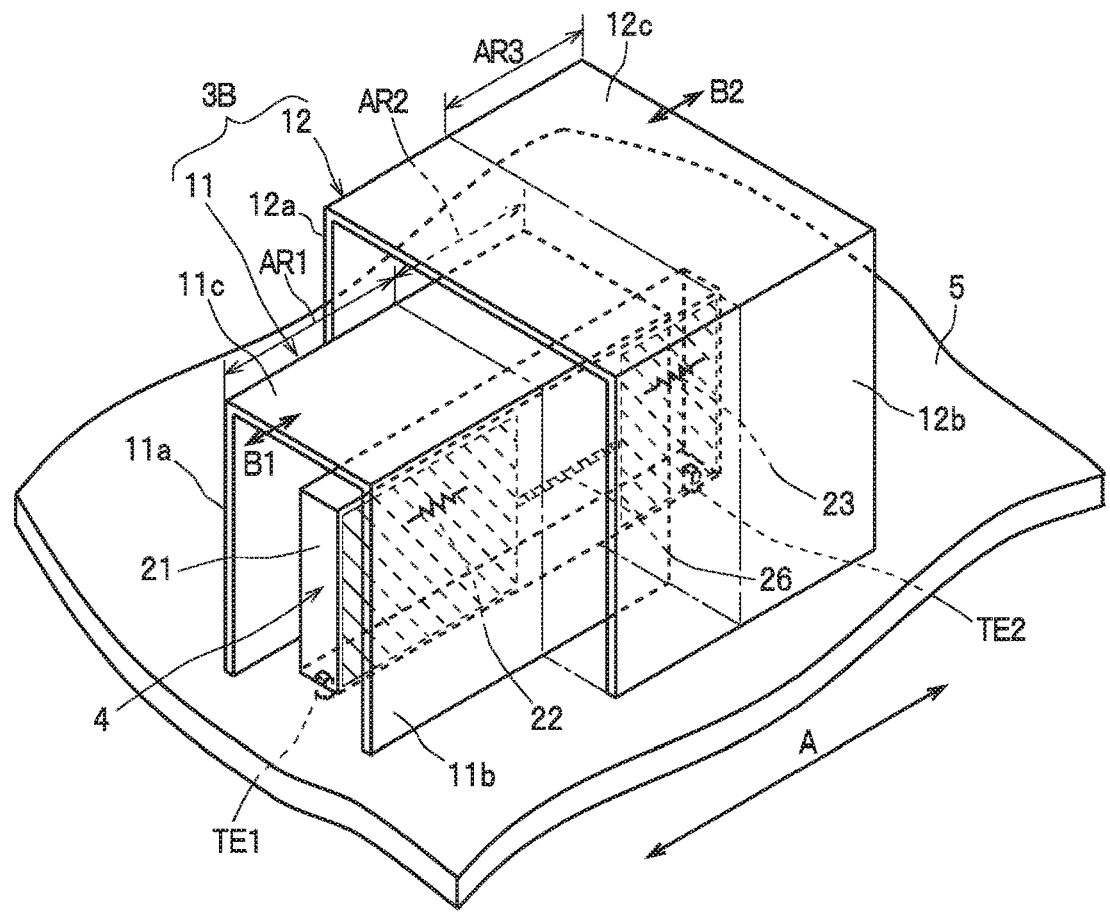
FIG. 7 is a perspective view useful in explaining a mounting structure for another capacitor and a resistance member mounted on a circuit board.

Note that although the mounting structure for the capacitor 3A and the resistance member 4 described above is a structure where the one electrode 11 and the other electrode 12 that construct the capacitor 3A are respectively mounted on the circuit board 5 so as to be disposed in substantially a U shape when viewed from above, a mounting structure for mounting the one electrode 11 and the other electrode 12 on the circuit board 5 is not limited to this and it is also possible to use the mounting structure depicted in FIG. 7. Another mounting structure for the capacitor 3A and the resistance member 4 will now be described with reference to FIG. 7. Note that elements that are the same as the mounting structure for the capacitor 3A and the resistance member 4 described above with reference to FIGS. 1 to 6 have been assigned the same reference numerals and duplicated description thereof is omitted. Since the resistance member 4 is also the same as the resistance member 4 described above, the following description will focus on the capacitor 3B.

As depicted in FIG. 7, the capacitor 3B includes the one electrode 11 as a first electrode where the pair of first side surface portions 11a and 11b that function as the first electrode forming portions and the first connecting plate portion 11c that spans between the first side surface portions 11a and 11b are formed in a U shape and the other electrode 12 as the second electrode where the pair of second side surface portions 12a and 12b that function as the second electrode forming portions and the second connecting plate portion 12c that spans between the second side surface portions 12a and 12b are formed in a U shape.

In the capacitor 3B, the one electrode 11 is mounted (disposed) in a state where the first side surface portions 11a and 11b are erected on the circuit board 5 as leg portions and the resistance member 4 is spanned. The other electrode 12 is mounted (disposed) in a state where the second side surface portions 12a and 12b disposed outside the first side surface portions 11a and 11b are erected on the circuit board 5 as leg portions and the resistance member 4 and the one electrode 11 are spanned (that is, a state where the resistance member 4 and part of the one electrode 11 are covered).

Although the first connecting plate portion 11c and the second connecting plate portion 12c are members disposed so as to be parallel to the length direction A in the capacitor 3B, the first connecting plate portion 11c and the second connecting plate portion 12c are not members that can be disposed in a state capable of facing the resistance member 4 ("facing" here refers to a state that is parallel to the surface of the resistance member 4 where the first resistance body 22 and the second resistance body 23 are disposed). Accordingly, the capacitor 3B is configured so that the first connecting plate portion 11c does not function as a first electrode forming portion and the second connecting plate portion 12c does not function as a second electrode forming portion.

Like the capacitor 3A, the capacitor 3B is formed by mounting (disposing) the first side surface portions 11a and 11b of the one electrode 11 on the circuit board 5 according to a positional relationship capable of ensuring that parts of the first side surface portions 11a and 11b are non-facing surfaces that do not overlap a facing side surface portion out of the second side surface portions 12a and 12b of the other electrode 12. In more detail, as depicted in FIG. 7, it is ensured that the first side surface portions 11*a* and 11*b* each have a non-facing surface (the part in the area AR1 in FIG. 7) that does not overlap the second side surface portions 12*a* and 12*b* of the other electrode 12 and a facing surface (the part in the area AR2 in FIG. 7) that overlaps the second side surface portions 12*a* and 12*b*. In addition, in the capacitor 3B, it is ensured that the first connecting plate portion 11*c* has a non-facing surface (the part in the area AR1 in FIG. 7) that does not overlap the second connecting plate portion 12*c* of the other electrode 12 and a facing surface (the part in the area AR2 in FIG. 7) that overlaps the second connecting plate portion 12*c*.

It is also ensured that the second side surface portions 12*a* and 12*b* each have a non-facing surface (the part in the area AR3 in FIG. 7) that does not overlap the first side surface portions 11*a* and 11*b* of the one electrode 11 and a facing surface (a surface that faces the parts in the area AR2 of the first side surface portions 11*a* and 11*b*) that overlaps the first side surface portions 11*a* and 11*b*. In addition, in the capacitor 3B, it is ensured that the second connecting plate portion 12*c* has a non-facing surface (the part in the area AR3 in FIG. 7) that does not overlap the first connecting plate portion 11*c* of the one electrode 11 and a facing surface (a surface that faces the part of the first connecting plate portion 11*c* in the area AR2) that overlaps the first connecting plate portion 11*c*.

The resistance member 4 depicted in FIG. 7 has the same configuration as the resistance member 4 described above with reference to FIGS. 2 and 3 and is mounted on the capacitor 3B so that the positional relationship of the first resistance body 22 and the second resistance body 23 with respect to the first electrode forming portions (the first side surface portions 11*a* and 11*b*) and the second electrode forming portions (the second side surface portions 12*a* and 12*b*) of the capacitor 3B is the same as the positional relationship in the mounting structure for the capacitor 3A and the resistance member 4 described above with reference to FIG. 2. The resistance member 4 is connected in parallel to the capacitor 3B by having one terminal TE1 connected via the circuit board 5 to the one electrode 11 (in this example, one of the first side surface portions 11*a* and 11*b*) and by having the other terminal TE2 connected via the circuit board 5 to the other electrode 12 (in this example, one of the second side surface portions 12*a* and 12*b*).

Figure 8:
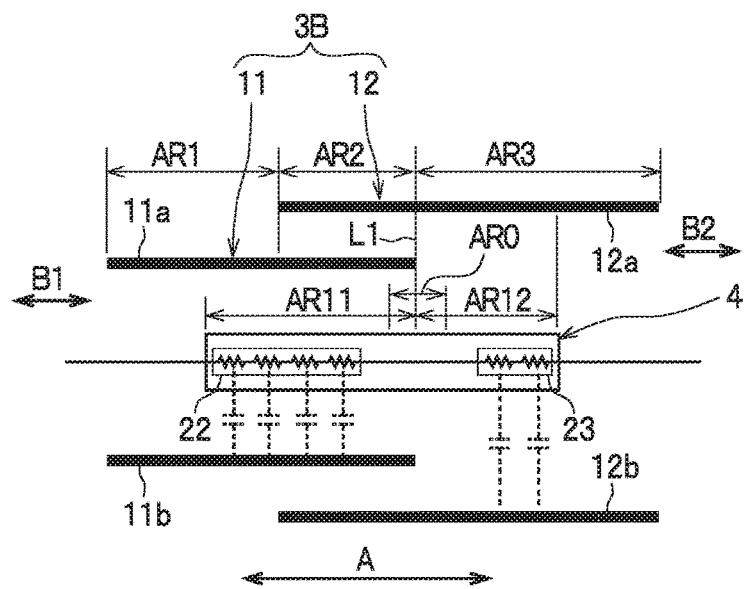
FIG. 8 is a schematic diagram useful in explaining a mounting structure for a capacitor and a resistance member when looking from above.

Accordingly, as depicted in FIG. 8 that schematically depicts the mounting structure for the capacitor 3B and the resistance member 4 when looking from above, in the resistance member 4, the first resistance body 22 is formed at a part of the area AR11 that is not included in the area AR0 and is a resistance body disposed so as to directly face only the first side surface portions 11*a* and 11*b* as the first electrode forming portions of the capacitor 3B, and the second resistance body 23 is formed at a part of the area AR12 that is not included in the area AR0 and is a resistance body disposed so as to directly face only the second side surface portions 12*a* and 12*b* as the second electrode forming portions of the capacitor 3B.

In this way, with the mounting structure for the capacitor 3B and the resistance member 4 depicted in FIGS. 7 and 8, even if the respective mounting positions of the one electrode 11 and the other electrode 12 are slightly displaced as indicated by the arrows B1 and B2 with respect to the resistance member 4 along the length direction A of the resistance member 4 (in this example, since the configuration ensures that the first side surface portions 11*a* and 11*b* and the first connecting plate portion 11*c* and the second side surface portions 12*a* and 12*b* and the second connecting plate portion 12*c* respectively have facing surfaces that overlap each other (the parts in the area AR2), displacements in the mounting positions of the other electrode 12 have no effect and it is mainly displacements in the mounting position of the one electrode 11 that have an effect), the resistance value of the first resistance body 22 in the resistance member 4 that directly faces only the first side surface portions 11*a* and 11*b* will not change and the resistance value of the second resistance body 23 in the resistance member 4 that directly faces only the second side surface portions 12*a* and 12*b* will also not change. Also, as depicted in FIG. 8, the capacitance value of the electrostatic capacitance formed between the first resistance body 22 and the first side surface portions 11*a* and 11*b* (for ease of understanding, only the electrostatic capacitance formed between the first resistance body 22 and the first side surface portion 11*b* is illustrated in FIG. 8) and the capacitance value of the electrostatic capacitance formed between the second resistance body 23 and the second side surface portions 12*a* and 12*b* (for ease of understanding, only the electrostatic capacitance formed between the second resistance body 23 and the second side surface portion 12*b* is illustrated in FIG. 8) will hardly change. From this, it can be understood that if the respective mounting positions of the one electrode 11 and the other electrode 12 are displaced along the length direction A as depicted by the arrows B1 and B2, the electrical characteristics (for example, the frequency characteristics) of a voltage inputter constructed by a parallel circuit composed of the capacitor 3B and the resistance member 4 will hardly change.

Accordingly, with the mounting structure for the capacitor 3B and the resistance member 4 depicted in FIGS. 7 and 8 also, it is possible to achieve the same effects as the mounting structure for the capacitor 3A and the resistance member 4 described above, including the effect that mounting so that the first electrode forming portions (the first side surface portions 11*a* and 11*b*) of the one electrode 11 and the second electrode forming portions (the second side surface portions 12*a* and 12*b*) of the other electrode 12 become parallel to the length direction A of the resistance member 4 is facilitated.

Also, with the capacitor 3A described above, although the first side surface portions 11*a* and 11*b* and the second side surface portions 12*a* and 12*b* each have one electrode forming portion by being formed as a rectangular flat plate made of a conductive metal material (the first side surface portions 11*a* and 11*b* described above themselves construct the first electrode forming portions and the second side surface portions 12*a* and 12*b* themselves construct the second electrode forming portions), at least one pair out of the pair of the first side surface portions 11*a* and 11*b* and the pair of the second side surface portions 12*a* and 12*b* may include two or more electrode forming portions. As one example, a mounting structure for a capacitor 3C, in which the pair of the first side surface portions 11*a* and 11*b* and the pair of the second side surface portions 12*a* and 12*b* each include two electrode forming portions, and a resistance member 4 of a configuration that corresponds to this capacitor 3C will now be described. Note that in the present embodiment, for ease of understanding, a perspective view like FIG. 2 and FIG. 7 has been omitted and the description will instead refer to FIG. 9 that schematically depicts the mounting structure for the capacitor 3C and the resistance member 4 by way of a plan view.

The structure of the capacitor 3C will now be described. Note that since the capacitor 3C is a modification to the capacitor 3A depicted in FIG. 2, the capacitor 3C is described in comparison to the capacitor 3A.

Figure 9:
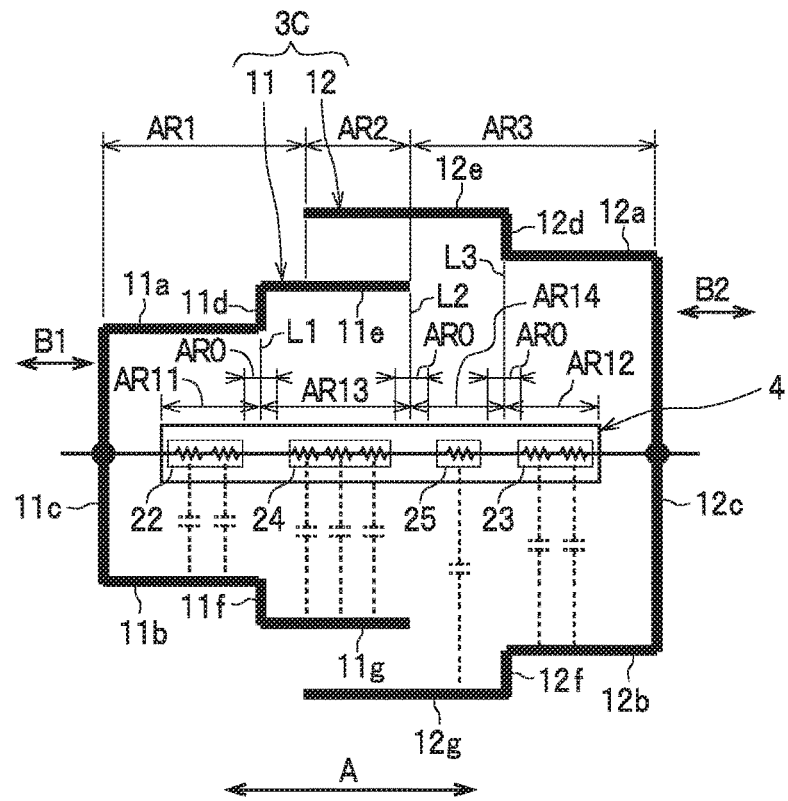
FIG. 9 is a schematic diagram useful in explaining a mounting structure for another capacitor and a resistance member when looking from above.

As depicted in FIG. 9, in the same way as the capacitor 3A, the capacitor 3C includes the one electrode 11 as a first electrode and the other electrode 12 as a second electrode that are mounted on the circuit board 5 with a gap in between. Both electrodes 11 and 12 are formed of a conductive metal material and the capacitor 3C is configured with the air present between the two electrodes 11 and 12 as a dielectric.

In more detail, as depicted in FIG. 9, the one electrode 11 includes the pair of first side surface portions 11a and 11b and the first connecting plate portion 11c that spans between the first side surface portions 11a and 11b substantially perpendicularly to the first side surface portions 11a and 11b. The configuration of mounting (disposing) these elements on the circuit board 5 in substantially a U shape when viewed from above is the same as in the one electrode 11 depicted in FIG. 2. On the other hand, the one electrode 11 depicted in FIG. 9 differs to the one electrode 11 depicted in FIG. 2 in the configuration where another first side surface portion 11e, which is parallel to the first side surface portion 11a and in the form of a rectangular flat plate, is connected via another first connecting plate portion 11d, which is parallel to the first connecting plate portion 11c and in the form of a rectangular flat plate, to the front end of the first side surface portion 11a and the configuration where another first side surface portion 11g, which is parallel to the first side surface portion 11b and in the form of a rectangular flat plate, is connected via another first connecting plate portion 11f, which is parallel to the first connecting plate portion 11c and in the form of a rectangular flat plate, to the front end of the first side surface portion 11b. Here, the lengths along the length direction A of the first side plate portion 11e and the first side plate portion 11g are set equal. As one example in the present embodiment, the first side plate portion 11e and the first side plate portion 11g are mounted (disposed) at positions that are further from the resistance member 4 than the first side surface portions 11a and 11b, but it is also possible to use a configuration where the first side plate portion 11e and the first side plate portion 11g are mounted (disposed) at positions that are closer to the resistance member 4 than the first side surface portions 11a and 11b.

As depicted in FIG. 9, the other electrode 12 includes the pair of second side surface portions 12a and 12b and the second connecting plate portion 12c that spans between the second side surface portions 12a and 12b substantially perpendicularly to the second side surface portions 12a and 12b. The configuration of mounting (disposing) these elements on the circuit board 5 in substantially a U shape when viewed from above so as to be combined with the opposite orientation to the one electrode 11 is the same as in the other electrode 12 depicted in FIG. 2. On the other hand, the other electrode 12 depicted in FIG. 9 differs to the other electrode 12 depicted in FIG. 2 in the configuration where another second side surface portion 12e, which is parallel to the second side surface portion 12a and in the form of a rectangular flat plate, is connected via another second connecting plate portion 12d, which is parallel to the second connecting plate portion 12c and in the form of a rectangular flat plate, to the front end of the second side surface portion 12a and the configuration where another second side surface portion 12g, which is parallel to the second side surface portion 12b and in the form of a rectangular flat plate, is connected via another second connecting plate portion 12f, which is parallel to the second connecting plate portion 12c and in the form of a rectangular flat plate, to the front end of the second side surface portion 12b. Here, the lengths along the length direction A of the second side plate portion 12e and the second side plate portion 12g are set equal. As one example in the present embodiment, the second side plate portion 12e and the second side plate portion 12g are mounted (disposed) at positions that are further from the resistance member 4 than the second side surface portions 12a and 12b, but it is also possible to use a configuration where the second side plate portion 12e and the second side plate portion 12g are mounted (disposed) at positions that are closer to the resistance member 4 than the second side surface portions 12a and 12b.

With this configuration, in the one electrode 11 of the capacitor 3C, the first side surface portions 11a and 11b construct the first electrode forming portions and the other first side surface portions 11e and 11g construct other electrode forming portions (hereinafter referred to as "third electrode forming portions"). Likewise, in the other electrode 12 of the capacitor 3C, the second side surface portions 12a and 12b construct the second electrode forming portions and the other second side surface portions 12e and 12g construct other electrode forming portions (hereinafter referred to as "fourth electrode forming portions").

The capacitor 3C is formed by mounting (disposing) the one electrode 11 and the other electrode 12 on the circuit board 5 with a positional relationship such that only the respective front ends of the first side surface portions 11e and 11g of the one electrode 11 and the respective front ends of the second side surface portions 12e and 12g of the other electrode 12 may have facing surfaces (that is, parts in the area AR2 in FIG. 9) that overlap each other. This means that it is ensured that in the one electrode 11, the entire first side surface portions 11a and 11b and the base ends of the first side surface portions 11e and 11g have non-facing surfaces (that is, parts in the area AR1 in FIG. 9) that do not overlap the second side surface portions 12a, 12b, 12e, and 12g of the other electrode 12 side. Likewise, it is ensured that in the first electrode 12, the entire second side surface portions 12a and 12b and the base ends of the second side surface portions 12e and 12g have non-facing surfaces (that is, the portions in the area AR3 in FIG. 9) that do not overlap the first side surface portions 11a, 11b, 11e, and 11g of the one electrode 11 side.

Since the capacitor 3A is configured so that the one electrode 11 and the other electrode 12 have only two electrode forming portions in the form of the first electrode forming portions (the first side surface portions 11a and 11b) and the second electrode forming portions (the second side surface portions 12a and 12b), there is only one boundary line, the boundary line L1, between the different electrode forming portions. In the capacitor 3C however where the one electrode 11 and the other electrode 12 have four electrode forming portions (the first electrode forming portions to the fourth electrode forming portions), as depicted in FIG. 9, there are three boundary lines, the boundary line L1 between the first electrode forming portions (the first side surface portions 11a and 11b) and the third electrode forming portions (the first side surface portions 11e and 11g), the boundary line L2 between the third electrode forming portions (the first side surface portions 11e and 11g) and the fourth electrode forming portions (the second side surface portions 12e and 12g), and the boundary line L3 between the fourth electrode forming portions (the second side surface portions 12e and 12g) and the second electrode forming portions (the second side surface portions 12a and 12b). Accordingly, if the respective mounting positions of the one electrode 11 and the other electrode 12 are slightly displaced along the length direction A of the resistance member 4 as indicated by the arrows B1 and B2 (see FIG. 9), there are three areas AR0 where the boundary lines L1, L2, and L3 may be present as indicated in FIG. 9.

For this reason, as depicted in FIG. 9 for example, the resistance member 4 includes the first resistance body 22 that is disposed at a position (the area AR11) that directly faces the first electrode forming portions (the first side surface portions 11a and 11b) and is not included in the area AR0 (that is, at a position that directly faces only the corresponding first electrode forming portions), a third resistance body 24 that is disposed at a position (the area AR13) that directly faces the third electrode forming portions (the first side surface portions 11e and 11g) and is not included in the area AR0 (that is, at a position that directly faces only the corresponding third electrode forming portions), a fourth resistance body 25 that is disposed at a position (the area AR14) that directly faces the fourth electrode forming portions (the second side surface portions 12e and 12g) and is not included in the area AR0 (that is, at a position that directly faces only the corresponding fourth electrode forming portions), and the second resistance body 23 that is disposed at a position (the area AR12) that directly faces the second electrode forming portions (the second side surface portions 12a and 12b) and is not included in the area AR0 (that is, at a position that directly faces only the corresponding second electrode forming portions), with the first to fourth resistance bodies being disposed in a straight line in the above-mentioned order along the length direction A of the base 21 and connected in series.

By doing so, in the mounting structure for the capacitor 3C and the resistance member 4 depicted in FIG. 9, even when the respective mounting positions of the one electrode 11 and the other electrode 12 are slightly displaced as indicated by the arrows B1 and B2 along the length direction A of the resistance member 4 with respect to the resistance member 4, the resistance value of the first resistance body 22 in the resistance member 4 that directly faces only the first side surface portions 11a and 11b will not change, the resistance value of the third resistance body 24 in the resistance member 4 that directly faces only the first side surface portions 11e and 11g will not change, the resistance value of the fourth resistance body 25 in the resistance member 4 that directly faces only the second side surface portions 12e and 12g will not change, and the resistance value of the second resistance body 23 in the resistance member 4 that directly faces only the second side surface portions 12a and 12b will not change. Also, as depicted in FIG. 9, the capacitance value of the electrostatic capacitance formed between the first resistance body 22 and the first side surface portions 11a and 11b (for ease of understanding, only the electrostatic capacitance formed between the first resistance body 22 and the first side surface portion 11b is illustrated in FIG. 9), the capacitance value of the electrostatic capacitance formed between the third resistance body 24 and the first side surface portions 11e and 11g (for ease of understanding, only the electrostatic capacitance formed between the third resistance body 24 and the first side surface portion 11g is illustrated in FIG. 9), the capacitance value of the electrostatic capacitance formed between the fourth resistance body 25 and the second side surface portions 12e and 12g (for ease of understanding, only the electrostatic capacitance formed between the fourth resistance body 25 and the second side surface portion 12g is illustrated in FIG. 9), and the capacitance value of the electrostatic capacitance formed between the second resistance body 23 and the second side surface portions 12a and 12b (for ease of understanding, only the electrostatic capacitance formed between the second resistance body 23 and the second side surface portion 12b is illustrated in FIG. 9) will also hardly change. From this, even when the respective mounting positions of the one electrode 11 and the other electrode 12 are displaced as indicated by the arrows B1 and B2 along the length direction A, the electrical characteristics (for example, the frequency characteristics) of a voltage inputter constructed by a parallel circuit composed of the capacitor 3C and the resistance member 4 will hardly change.

Accordingly, the mounting structure for the capacitor 3C and the resistance member 4 depicted in FIG. 9 can achieve the same effects as the mounting structure for the capacitor 3A and the resistance member 4 described earlier.

Also, although the capacitor 3A described above is constructed so that the one electrode 11 as the first electrode has the pair of first electrode forming portions (the first side surface portions 11a and 11b) mounted on both sides so as to sandwich the resistance member 4 and the other electrode 12 as the second electrode has the pair of second electrode forming portions (the second side surface portions 12a and 12b) mounted on both sides so as to sandwich the resistance member 4, it is also possible to configure the capacitor 3A with only one first side surface portion and one second side surface portion positioned on the same side with respect to the resistance member 4 (that is, only the first side surface portion 11a and the second side surface portion 12a or only the first side surface portion 11b and the second side surface portion 12b). This is also the case for the capacitor 3C described above, so that it is also possible to construct the capacitor 3C of only the two first side surface portions and a first connecting plate portion and two second side surface portions and a second connecting plate portion positioned on the same side with respect to the resistance member 4 (only the first side surface portions 11a and 11e and the first connecting plate portion 11d and the second side surface portions 12a and 12e and the second connecting plate portion 12d, or only the first side surface portions 11b and 11g and the first connecting plate portion 11f and the second first side surface portions 12b and 12g and the second connecting plate portion 12f).

Also, although a mounting structure for the capacitor 3C, which includes the one electrode 11 as the first electrode that has two types of electrode forming portions (the first electrode forming portions and the third electrode forming portions) and the other electrode 12 as the second electrode that has two types of electrode forming portions (the second electrode forming portions and the fourth electrode forming portions), and the resistance member 4 with four resistance bodies (the first resistance body 22 to the fourth resistance body 25) corresponding to the capacitor 3C has been described, although not illustrated, the one electrode 11 as a first electrode may be configured with three or more electrode forming portions and the other electrode 12 as the second electrode may also be configured with three or more electrode forming portions. That is, it is possible for the one electrode 11 as the first electrode to be configured so as to include n (where n is an integer of two or higher) electrode forming portions and for the other electrode 12 as the second electrode to be configured so as to include m (where m is an integer of two or higher) electrode forming portions. In this case, the number of electrode forming portions in the one electrode 11 as the first electrode may be the same as the number of electrode forming portions in the other electrode 12 as the second electrode, or may be different.

Also, although not illustrated, it is also possible to use a configuration where the number of electrode forming portions in one electrode out of the one electrode 11 as the first electrode and the other electrode 12 as the second electrode is plural and the number of electrode forming portions in the other electrode is singular.

With this configuration, at a position where the resistance member 4 faces at least one electrode, out of the one electrode 11 as the first electrode and the other electrode 12 as the second electrode, where the number of electrode forming portions is plural (as one example, n portions), n resistance bodies that correspond one-to-one to the n electrode forming portions are disposed in a straight line along the length direction A of the resistance member 4 and the n resistance bodies are connected in series. The resistance member 4 is mounted so that these n resistance bodies are positioned directly facing only the respectively corresponding electrode forming portions.

According to this mounting structure for a capacitor and a resistance member, even if at least one electrode that is constructed of n electrode forming portions is somewhat displaced along the length direction A of the resistance member 4, since a state where each of n resistance bodies that construct the resistance member 4 directly faces only the corresponding one out of the n electrode forming portions is maintained, it is possible to minimize the influence of the mounting position of the at least one electrode being displaced along the length direction on the electrical characteristics of an electronic circuit including a parallel circuit composed of the capacitor and the resistance member.

Figure 10:
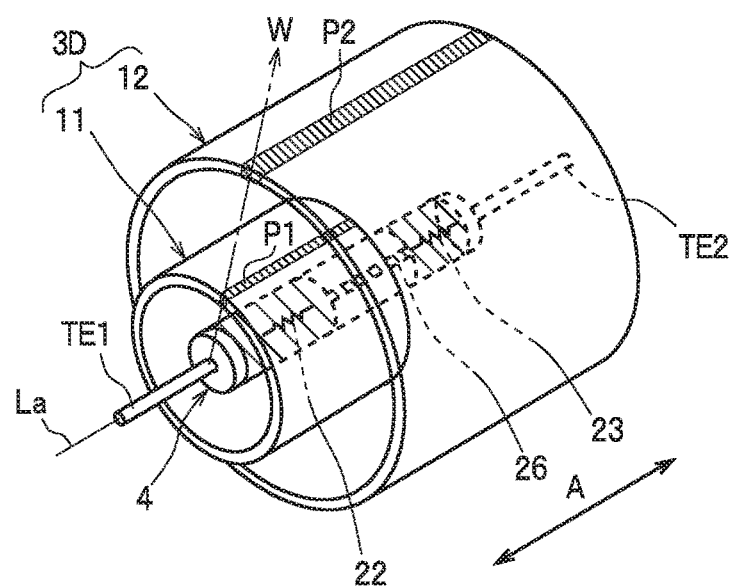
FIG. 10 is a schematic diagram useful in explaining a mounting structure for another capacitor and a resistance member when looking from above.

Also, although the electrode forming portions of the one electrode 11 as the first electrode and the electrode forming portions of the other electrode 12 as the second electrode are formed as rectangular flat plates in the examples described above, the present invention is not limited to this configuration and as depicted in FIG. 10, it is also possible to construct a capacitor 3D of the one electrode 11 as a tube-shaped first electrode with a constant diameter and the other electrode 12 as a tube-shaped second electrode with a constant diameter which is larger than the diameter of the one electrode 11. Also, in the mounting structure for the capacitor 3D of this configuration and the resistance member 4, the tube-shaped one electrode 11 is mounted with respect to the resistance member 4 (whose external form is a cylindrical column with a constant diameter as one example in the present embodiment, but provided that the cross-sectional form is the same along the length direction A, the external form may be an elliptical or polygonal cylinder) so that its axis, not illustrated, is parallel to the length direction A of the resistance member 4 so as to surround one end of the resistance member 4 and the tube-shaped other electrode 12 is mounted so that its axis, not illustrated, is parallel to the length direction A of the resistance member 4 so as to surround the other end of the resistance member 4 and one end of the one electrode 11 (the other end of the resistance member 4 side of the one electrode 11).

In the capacitor 3D according to this configuration, for the tube-shaped one electrode 11 and the tube-shaped second electrode 12, narrow portions (the portion P1 that has been obliquely shaded for the one electrode 11 and the portion P2 that has been obliquely shaded for the other electrode 12) along the length direction A that are positioned in the same direction from the axis (center axis) La of the resistance member 4 (the direction indicated by the arrow W as one example in FIG. 10) are parts that are disposed in a parallel state along the length direction A and therefore respectively function as the first electrode forming portion and the second electrode forming portion in the same way as the one electrode 11 and the other electrode 12 in the form of rectangular flat plates that construct the capacitor 3A for example. Since the tube-shaped one electrode 11 is composed of such portions P1 that are aligned and connected to one another around a concentric circle centered on the axis, the entire one electrode 11 functions as a first electrode forming portion. In the same way, since the tube-shaped other electrode 12 is composed of the portions P2 that are aligned and connected to one another around a concentric circle centered on the axis, the entire other electrode 12 functions as a second electrode forming portion.

Accordingly, even when the capacitor 3D is used, in the same way as when the capacitor 3A is used, as depicted in FIG. 10, the first resistance body 22 corresponding to the one electrode 11 as the first electrode forming portion and the second resistance body 23 corresponding to the other electrode 12 as the second electrode forming portion are disposed on a base so as to be separated along the length direction A and are connected in series via the wire 26 to construct the resistance member 4. In more detail, in the resistance member 4 depicted in FIG. 10, a base, not illustrated, is formed in a columnar shape corresponding to the external form of the resistance member 4 (as one example, a cylindrical column when the external form of the resistance member 4 is a cylindrical column, and a polygonal column when the external form of the resistance member 4 is a polygonal column) and the first resistance body 22 and the second resistance body 23 are separately formed along the length direction A on the surface of the base using carbon film resistors, metal film resistors, or wound resistors. The resistance member 4 is mounted together with the capacitor 3D so that the first resistance body 22 is positioned so as to directly face only the corresponding one electrode 11 and the second resistance body 23 is positioned so as to directly face only the corresponding other electrode 12. Note that when the capacitor 3D and the resistance member 4 are mounted on the circuit board 5 in the state depicted in FIG. 10, it is possible to use a variety of mounting structures, such as mounting on the circuit board 5 via a support member formed of an insulating material.

By doing so, the mounting structure for the capacitor 3D and the resistance member 4 depicted in FIG. 10 is also capable of achieving the same effects as the mounting structure for the capacitor 3A and the resistance member 4 described above.

Although the capacitors 3A, 3B, 3C, and 3D described above are configured so that the other electrode 12 is mounted in a state where one part of the other electrode 12 is disposed outside one part of the one electrode 11 and the one electrode 11 has both a non-facing surface (the part in the area AR1 described above) that does not overlap the other electrode 12 and a facing surface (the part in the area AR2 described above) that overlaps the other electrode 12, the present invention is not limited to this configuration. As one example, the capacitor may be configured so that the one electrode 11 does not have a facing surface (the part in the area AR2) that overlaps the other electrode 12. This capacitor and a resistance member corresponding to this capacitor will now be described with reference to the schematic diagram in FIG. 11. Note that a capacitor 3E, where the configuration described above (a configuration where the one electrode 11 does not have a part in the area AR2) is applied to the basic configuration of the capacitor 3A out of the capacitors 3A, 3B, 3C, and 3D, will be described as one example. Accordingly, elements that are the same as the capacitor 3A have been assigned the same reference numerals and duplicated description is omitted. Note that it should be obvious that this configuration (a configuration where the one electrode 11 does not have a part in the area AR2) can also be applied to the basic configuration of the capacitors 3B, 3C, and 3D. Elements of the resistance member 4 that are the same as the resistance member 4 corresponding to the capacitor 3A have been assigned the same reference numerals and duplicated description is omitted.

In the capacitor 3E, since the one electrode 11 and the other electrode 12 do not overlap (a configuration where the one electrode 11 does not have a facing surface that overlaps the other electrode 12 (the part in the area AR2 described above), the area AR2 of the capacitor 3A does not exist. That is, there is no boundary line between the first electrode forming portions (the first side surface portions 11a and 11b) and the second electrode forming portions (the second side surface portions 12a and 12b). In this example, for explanation purposes, a front position of the second electrode forming portion (second side surface portions 12a and 12b)-side of the first electrode forming portions (the first side surface portions 11a and 11b) is indicated by the reference numeral L11 and a front position of the first electrode forming portion (first side surface portions 11a and 11b)-side of the second electrode forming portions (the second side surface portions 12a and 12b) is indicated by the reference numeral L12.

In the capacitor 3E, when the respective mounting positions of the one electrode 11 and the other electrode 12 are slightly displaced along the length direction A of the resistance member 4 as indicated by the arrows B1 and B2 (see FIG. 11), the areas where the front positions L11 and L12 may be positioned are indicated by the label AR0. Since the areas AR0 do not overlap, a gap ARg is provided between the areas AR0. In the capacitor 3E depicted in FIG. 11, the distance between the second side surface portions 12a and 12b is set longer than the distance between the first side surface portions 11a and 11b in keeping with the configuration of the capacitor 3A, and although not illustrated, the distance may be set the same as the distance between the first side surface portions 11a and 11b or may be set smaller than the distance between the first side surface portions 11a and 11b.

As depicted in FIG. 3, the resistance member 4 corresponding to the capacitor 3E is configured with the first resistance body 22 and the second resistance body 23 that correspond one-to-one to the first electrode forming portions (the first side surface portions 11a and 11b) and the second electrode forming portions (the second side surface portions 12a and 12b) separately disposed along the length direction A and connected in series via the wire 26. In the present embodiment, since the one electrode 11 and the other electrode 12 do not overlap as described above, the entire part (the area AR11) of the base 21 that directly faces the first electrode forming portions (the first side surface portions 11a and 11b) is a part that directly faces only the corresponding first electrode forming portions and the entire part (the area AR12) of the base 21 that directly faces the second electrode forming portions (the second side surface portions 12a and 12b) is a part that directly faces only the corresponding second electrode forming portions.

Figure 11:
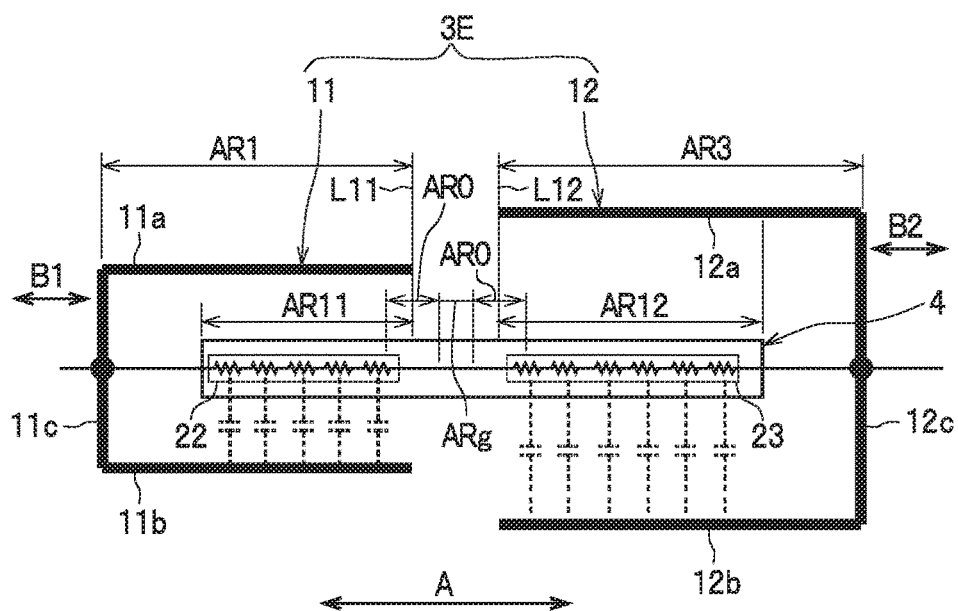
FIG. 11 is a schematic diagram useful in explaining a mounting structure for another capacitor and a resistance member when looking from above.
Figure 12:
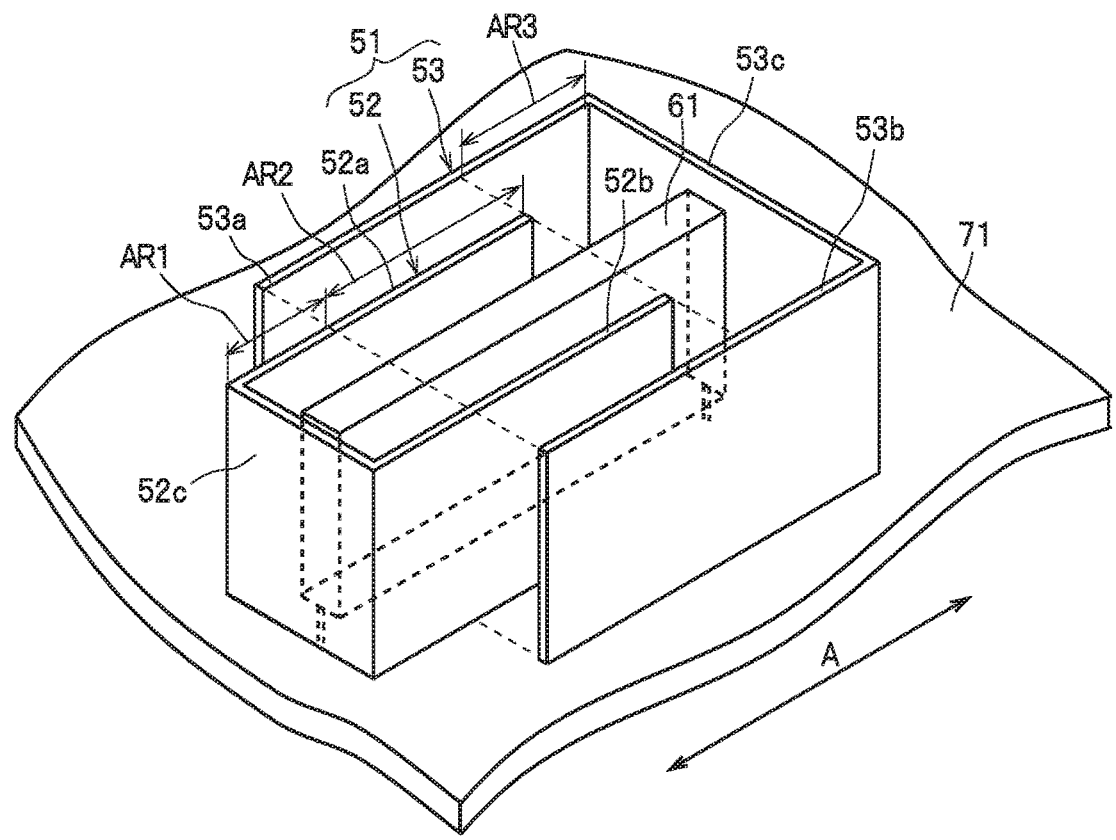
FIG. 12 is a perspective view useful in explaining a mounting structure for a capacitor and a resistance member mounted on a circuit board.

For this reason, the resistance member 4 has the first resistance body 22 disposed at any position in the area AR11 and the second resistance body 23 disposed at any position in the area AR12 and, as depicted in FIG. 11, is mounted so that the first resistance body 22 is positioned so as to directly face only the corresponding first electrode forming portions (the first side surface portions 11a and 11b) and the second resistance body 23 is positioned so as to directly face only the corresponding second electrode forming portions (the second side surface portions 12a and 12b).

By doing so, the mounting structure for the capacitor 3E and the resistance member 4 depicted in FIG. 11 is also capable of achieving the same effects as the capacitor 3A and the resistance member 4 described above.

Note that since the capacitor 3E is configured so that the gap ARg is provided between the respective areas AR0 in which the front positions L11 and L12 may be positioned, it is possible to use a configuration where a resistance body, not illustrated, is disposed at a position on the base 21 corresponding to the gap ARg (that is, a resistance body that is separate to the first resistance body 22 and the second resistance body 23 and is connected in series with the resistance bodies 22 and 23). Since this resistance body is a resistance body disposed at a position that does not directly face either of the first electrode forming portions (the first side surface portions 11a and 11b) and the second electrode forming portions (the second side surface portions 12a and 12b), even if the respective mounting positions of the one electrode 11 and the other electrode 12 are displaced along the length direction A as indicated by the arrows B1 and B2, there will be hardly any change in the electrical characteristics (for example, the frequency characteristics) of a voltage inputter constructed of a parallel circuit composed of the capacitor 3E and the resistance member 4. Accordingly, a configuration where a further resistance body is disposed at a position in the resistance member 4 corresponding to the gap ARg is also capable of achieving the same effects as the mounting structure for the capacitor 3A and the resistance member 4 described earlier.

It should be obvious that the respective mounting structures for a capacitor and a resistance member described above can be used not only when mounting on a circuit board but also when mounting in locations aside from a circuit board.

Next, an input unit equipped with the mounting structure for a capacitor and a resistance member described above and a measuring apparatus equipped with this input unit will be described with reference to FIG. 13.

A measuring apparatus 100 as a measuring apparatus according to the present invention includes one or two or more input units 101 and a measuring apparatus main body 102. As one example, a measuring apparatus 100 includes two input units 101 that are an input unit 101a, into which an input voltage Vin1 whose voltage value changes according to a current value of a current flowing in a measured object (not illustrated) such as a resistance body (as one example, a voltage signal from a current detecting probe that detects this current) is inputted, and an input unit 101b, into which an input voltage Vin2 whose voltage value changes according to a voltage value of a voltage generated in the measured object due to the current flowing (as one example, a voltage signal from a voltage detecting probe that detects this voltage) is inputted. When no distinction is made between the input units 101a and 101b, the units are collectively referred to as the "input units 101". The measuring apparatus 100 measures the power, current, and voltage as measured amounts for the measured object.

Figure 13:
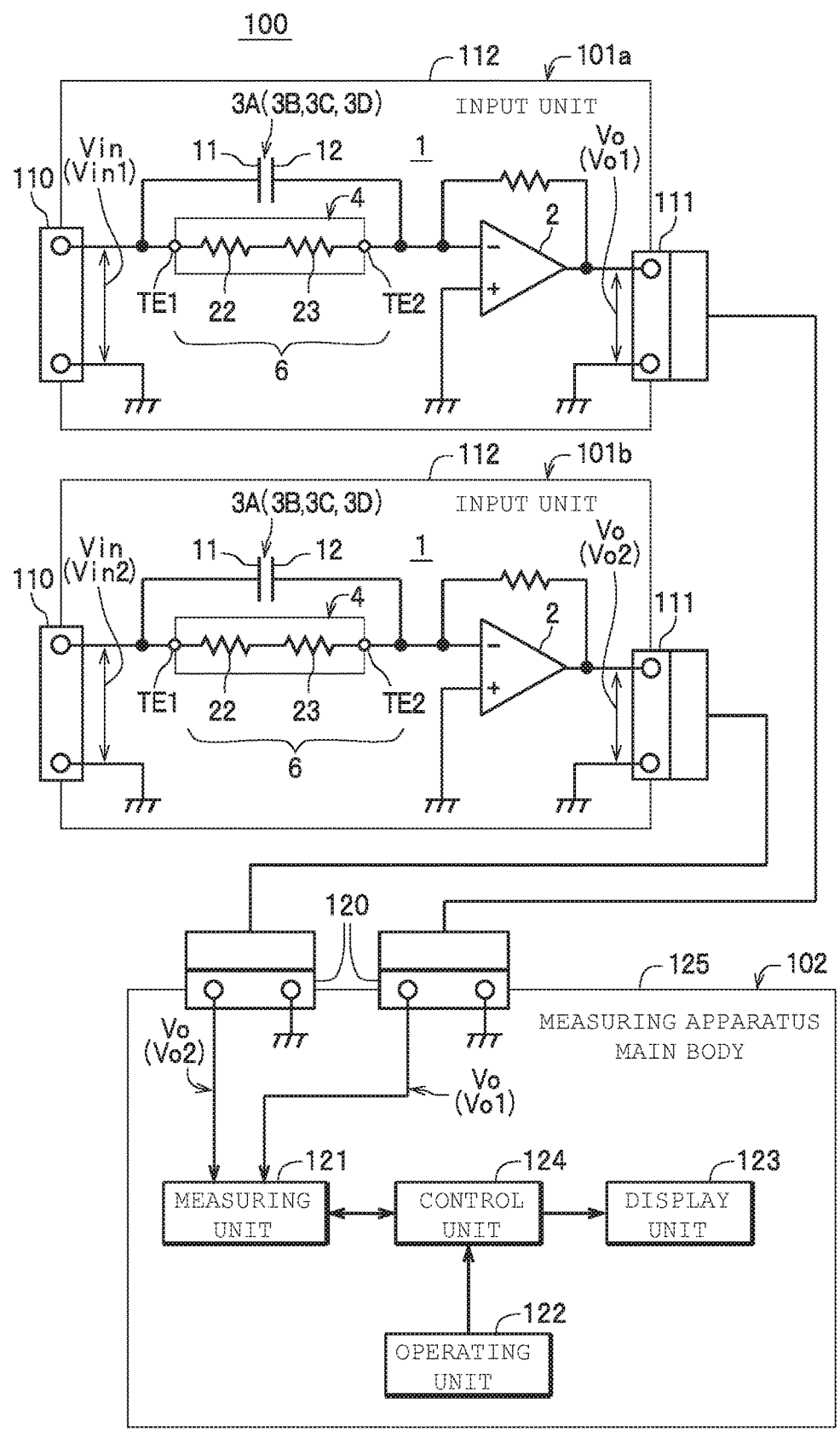
FIG. 13 is a block diagram useful in explaining the respective configurations of input units and a measuring apparatus.

As depicted in FIG. 13, the input units 101a and 101b are separately configured and have the same configuration with each including the electronic circuit 1 depicted in FIG. 1, an input unit 110, an output unit 111, and a frame 112. The frame 112 is constructed as a case, for example, internally houses the electronic circuit 1, and has the input unit 110 and the output unit 111 disposed on wall surfaces thereof. Note that the frame 112 is not limited to being configured in the form of a case and may be configured as a chassis (or support frame) to which the electronic circuit 1, the input unit 110, and the output unit 111 are attached in an exposed state and which integrally supports these elements.

As one example, the electronic circuit 1 includes an operational amplifier 2 and, as the input unit of the operational amplifier 2, a voltage inputter 6 composed of a parallel circuit with the capacitor 3A (or any of 3B, 3C, and 3D) and the resistance member 4 mounted using a mounting structure which is any of the mounting structures for a capacitor and resistor described above. The input unit 110 is constructed of a connector, for example, and outputs the input voltage Vin inputted from outside the input unit 101 into the voltage inputter 6 of the electronic circuit 1. The output unit 111 is constructed of a connector, for example, and outputs an output voltage Vo, which is outputted from the operational amplifier 2 of the electronic circuit 1, to the periphery of the input unit 101.

With this configuration, the input voltage Vin (the input voltage Vin1 or Vin2) inputted into the input unit 101 (the input unit 101a or 101b) is processed (as one example, when the electrical characteristics are frequency characteristics, a filtering process) by the electronic circuit 1 whose electrical characteristics are set by the electrical characteristics of the voltage inputter 6 constructed of a parallel circuit composed of the capacitor 3A (or any of 3B, 3C, and 3D) and the resistance member 4, and the processed voltage is outputted as the output voltage Vo (the output voltage Vo1 or Vo2).

Note that the input unit 101 is not limited to a configuration including the operational amplifier 2. As one example, although not illustrated, it is also possible to use a configuration that includes an attenuator in place of the operational amplifier 2. The input unit 101 is also not limited to a configuration that outputs the output voltage Vo as an analog signal. As one example, although not illustrated, it is also possible to use a configuration where, in addition to the operational amplifier 2 and/or an attenuator, an A/D converter is disposed as a following stage and the output voltage Vo is sampled to convert the output voltage Vo to a digital signal (waveform data indicating instantaneous values) that is outputted.

As one example, as depicted in FIG. 13, the measuring apparatus main body 102 includes input units 120, a measuring unit 121, an operating unit 122, a display unit 123, a control unit 124, and a frame 125 that houses these component elements, is formed separately to the respective input units 101, and is configured to be capable of inputting the input voltages Vin via the input units 101 connected to the measuring apparatus main body 102 as the output voltages Vo and measuring the measured amounts described above.

The input units 120 are constructed of connectors, for example, and are connected to the output unit 111 of each input unit 101. When connecting the input units 120 and the respective output units 111, it is possible to use a configuration where the connections are made using connecting cables. In place of this configuration, it is also possible to use a configuration where a rack for attaching the respective input units 101 is disposed inside the frame 125 of the measuring apparatus main body 102, connectors for connecting to the output units 111 of the attached input units 101 are disposed at attachment positions of the respective input units 101 on the rack, and these connectors are connected to the input units 120 via wiring and/or a (wiring pattern of a) backboard disposed on a rack. The input unit 120 inputs the output voltages Vo1 and Vo2 outputted from the input units 101a and 101b and outputs to the measuring unit 121.

In accordance with control by the control unit 124, the measuring unit 121 executes a process that inputs the output voltages Vo1 and Vo2, measures the measured amounts described above based on the output voltages Vo1 and Vo2, and outputs the measured amounts that have been measured to the control unit 124. The operating unit 122 includes a variety of switches and keys and outputs an operation signal when the switches and keys are operated. In accordance with control by the control unit 124, the display unit 123 displays various information, such as the measured amounts measured by the measuring unit 121. The control unit 124 controls the various component elements of the measuring apparatus main body 102 in accordance with the operation signals outputted from the operating unit 122.

In the measuring apparatus 100 with the configuration described above, the input units 101a and 101b execute a process on the input voltages Vin1 and Vin2 that have been inputted and output as the output voltages Vo1 and Vo2 to the measuring apparatus main body 102. The measuring apparatus main body 102 inputs the input voltages Vin1 and Vin2 via the input units 101a and 101b as the output voltages Vo1 and Vo2 and measures the measured amounts based on the output voltages Vo1 and Vo2.

Therefore, according to the input units 101a and 101b, since the respective voltage inputters 6 of the electronic circuits 1 are configured of parallel circuits composed of the capacitor 3A (or any of 3B, 3C, and 3D) and the resistance member 4 that are mounted using any mounting structure out of the mounting structures for a capacitor and a resistor described above, the influence of displacements in the mounting positions described above on the electrical characteristics of electronic circuits including the parallel circuits can be minimized. By doing so, according to the input units 101a and 101b, it is possible to execute the processing on the input voltages Vin1 and Vin2 in a state with little fluctuations (fluctuations in electrical characteristics) and output as the output voltages Vo1 and Vo2. According to the measuring apparatus 100 including the input units 101a and 101b, it is possible to measure the measured amounts in a state with little fluctuations based on the output voltages Vo1 and Vo2 that have been processed in this way in a state with little fluctuations.

Note that although the measuring apparatus 100 described above uses a configuration including the measuring apparatus main body 102 equipped with the operating unit 122 and the display unit 123, the present invention is not limited to this configuration. As one example, when the control unit 124 is configured to execute a series of control processes set in advance on the various component elements of the measuring apparatus main body 102, it becomes unnecessary to output operation signals from the operating unit 122 to the control unit 124, so that the operating unit 122 may be omitted. Also, in place of a configuration where the measuring apparatus main body 102 is provided with the display unit 123, it is also possible to use a configuration where a display apparatus corresponding to the display unit is disposed outside the measuring apparatus main body 102 and the measured amounts that have been measured by the control unit 124 are transmitted to and displayed on the display apparatus.

Although the measuring apparatus 100 measures voltage, current, and power as the measured amounts in the example described above, the present invention is not limited to a configuration that measures all of these measured amounts and it is also possible to use a configuration that measures any one or two out of these measured amounts. The measured amounts measured by the measuring apparatus 100 are not limited to voltage, current, and power and may include a phase difference between the current and voltage that may be calculated based on the output voltages Vo1 and Vo2 and/or the resistance of the measured object. Also, although a configuration where voltage signals indicating a current or voltage are inputted into the input units 101 as the input voltages Vin has been described, it is also possible to use a configuration that inputs voltage signals outputted from a detector or detectors that detect various physical values, such as temperature, humidity, distortion, brightness, and illuminance into the input unit 101 as the input voltages Vin. In this case, the measuring apparatus 100 measures various physical values such as temperature, humidity, distortion, brightness, and illuminance as the measured amounts. The present invention can also be applied to measuring devices that measure various chemical quantities such as atomic weight, molecular weight, and chemical formula weight as the measured amounts, and to electronic devices (display devices and recording devices) that do not have a measurement function for measured amounts. In such cases also, it is possible to achieve the effects described above.

What is claimed is:

1. A mounting structure for a capacitor and a resistor in a parallel circuit, comprising:
    a resistor; and
    a capacitor, in which a first electrode connected to one terminal of the resistor and a second electrode connected to another terminal of the resistor are formed,
    wherein the first electrode includes a first electrode forming portion disposed so as to be parallel to a length direction of the resistor,
    the second electrode includes a second electrode forming portion disposed so as to be parallel to the length direction of the resistor,
    the resistor is configured by disposing a first resistance body and a second resistance body, which correspond one-to-one to the first electrode forming portion and the second electrode forming portion, so as to be separated along the length direction and connecting the first resistance body and the second resistance body in series via a wire,
    the first electrode forming portion is configured so that a central portion in a length direction of the first electrode forming portion directly faces a whole of the first resistance body and that part of the first electrode forming portion aside from the central portion closer to the other terminal directly faces part of the wire,
    the second electrode forming portion is configured so that a central portion in a length direction of the second electrode forming portion directly faces a whole of the second resistance body and that part of the second electrode forming portion aside from the central portion closer to the one terminal directly faces part of the wire, and
    a resistance value of the wire is smaller than respective resistance values of the first resistance body and the second resistance body.

2. The mounting structure for a capacitor and a resistor according to claim 1,
    wherein the resistor includes a single base formed of an insulating material, and
    each resistance body is formed on a surface of the base along a length direction of the base as the length direction.

3. An input unit comprising a voltage inputter that inputs an input voltage,
    wherein the voltage inputter is configured by the parallel circuit composed of the resistor and the capacitor mounted using the mounting structure for a capacitor and a resistor according to claim 2.

4. A measuring apparatus that comprises the input unit according to claim 3 and measures measured amounts.

5. The mounting structure for a capacitor and a resistor according to claim 1,
    wherein the first electrode has a pair of first side surface portions that each function as the first electrode forming portion and a first connecting plate portion that spans between the first side surface portions disposed on a circuit board in a U shape when viewed from above,
    the second electrode has a pair of second side surface portions that each function as the second electrode forming portion and a second connecting plate portion that spans between the second side surface portions disposed on the circuit board in a U shape with an opposite orientation to the first electrode when viewed from above, and
    the resistor is disposed on the circuit board in a state where a disposed part of the first resistance body is positioned on an inside of the pair of first side surface portions and a disposed part of the second resistance body is positioned on an inside of the pair of second side surface portions.

6. An input unit comprising a voltage inputter that inputs an input voltage,
    wherein the voltage inputter is configured by the parallel circuit composed of the resistor and the capacitor mounted using the mounting structure for a capacitor and a resistor according to claim 5.

7. A measuring apparatus that comprises the input unit according to claim 6 and measures measured amounts.

8. The mounting structure for a capacitor and a resistor according to claim 1,
    wherein the first electrode is formed in a U shape with a pair of first side surface portions that each function as the first electrode forming portion and a first connecting plate portion that spans between the first side surface portions, and is disposed in a state where the pair of first side surface portions are erected on a circuit board as leg portions,
    the second electrode is formed in a U shape with a pair of second side surface portions that each function as the second electrode forming portion and a second connecting plate portion that spans between the second side surface portions, and is disposed in a state where the pair of second side surface portions are erected on the circuit board as leg portions, and
    the resistor is disposed on the circuit board in a state where a disposed part of the first resistance body is positioned on an inside of the pair of first side surface portions and a disposed part of the second resistance body is positioned on an inside of the pair of second side surface portions.

9. An input unit comprising a voltage inputter that inputs an input voltage,
    wherein the voltage inputter is configured by the parallel circuit composed of the resistor and the capacitor mounted using the mounting structure for a capacitor and a resistor according to claim 8.

10. A measuring apparatus that comprises the input unit according to claim 9 and measures measured amounts.

11. An input unit comprising a voltage inputter that inputs an input voltage, wherein the voltage inputter is configured by the parallel circuit composed of the resistor and the capacitor mounted using the mounting structure for a capacitor and a resistor according to claim 1.

12. A measuring apparatus that comprises the input unit according to claim 11 and measures measured amounts.

13. A mounting structure for a capacitor and a resistor in a parallel circuit, comprising:
   a resistor; and
   a capacitor, in which a first electrode connected to one terminal of the resistor and a second electrode connected to another terminal of the resistor are formed,
   wherein at least one of the first electrode and the second electrode includes n, where n is an integer of two or higher, electrode forming portions aligned along a length direction of the resistor so as to be parallel to the length direction,
   the resistor is configured by disposing n resistance bodies, which correspond one-to-one to the n electrode forming portions so as to be separated along the length direction and connecting the n resistance bodies in series via wires,
   the at least one of the first electrode and the second electrode is configured so that central portions in a length direction of the at least one of the first electrode and the second electrode of the electrode forming portions directly face a whole of respective resistance bodies corresponding one-to-one, and that parts of the at least one of the first electrode and the second electrode aside from the central portions closer to the other terminal directly face respective parts of the wires, and
   resistance values of the wires are smaller than respective resistance values of the resistance bodies.

14. The mounting structure for a capacitor and a resistor according to claim 13,
   wherein the resistor includes a single base formed of an insulating material, and
   each resistance body is formed on a surface of the base along a length direction of the base as the length direction.

15. An input unit comprising a voltage inputter that inputs an input voltage,
   wherein the voltage inputter is configured by the parallel circuit composed of the resistor and the capacitor mounted using the mounting structure for a capacitor and a resistor according to claim 14.

16. A measuring apparatus that comprises the input unit according to claim 15 and measures measured amounts.

17. An input unit comprising a voltage inputter that inputs an input voltage,
   wherein the voltage inputter is configured by the parallel circuit composed of the resistor and the capacitor mounted using the mounting structure for a capacitor and a resistor according to claim 13.

18. A measuring apparatus that comprises the input unit according to claim 17 and measures measured amounts.

* * * * *